(12) United States Patent
Nishio

(10) Patent No.: US 12,418,977 B2
(45) Date of Patent: Sep. 16, 2025

(54) CIRCUIT BOARD AND METHOD OF MANUFACTURING CIRCUIT BOARD

(71) Applicant: Murata Manufacturing Co., Ltd., Nagaokakyo (JP)

(72) Inventor: Kosuke Nishio, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 322 days.

(21) Appl. No.: 18/204,978

(22) Filed: Jun. 2, 2023

(65) Prior Publication Data

US 2023/0319980 A1    Oct. 5, 2023

Related U.S. Application Data

(63) Continuation of application No. PCT/JP2021/044203, filed on Dec. 2, 2021.

(30) Foreign Application Priority Data

Dec. 7, 2020    (JP) .................................. 2020-202486

(51) Int. Cl.
*H05K 1/02* (2006.01)
*H01P 3/08* (2006.01)
(Continued)

(52) U.S. Cl.
CPC ............. *H05K 1/024* (2013.01); *H01P 3/082* (2013.01); *H05K 1/115* (2013.01); *H05K 3/4652* (2013.01)

(58) Field of Classification Search
None
See application file for complete search history.

(56) References Cited

U.S. PATENT DOCUMENTS

2010/0059896 A1    3/2010 Makita et al.
2013/0176646 A1    7/2013 Arai
(Continued)

FOREIGN PATENT DOCUMENTS

JP    H09321176 A    12/1997
JP    H10190316 A    7/1998
(Continued)

OTHER PUBLICATIONS

International Search Report in PCT/JP2021/044203, mailed Mar. 1, 2022, 4 pages.
(Continued)

*Primary Examiner* — Timothy J Thompson
*Assistant Examiner* — John B Freal
(74) *Attorney, Agent, or Firm* — Keating & Bennett, LLP

(57) ABSTRACT

A circuit board includes one or more insulator layers, and upper and lower principal surfaces, and conductor layers in or on the substrate body. The conductor layers include a pair of first and second conductor layers on one of the insulator layers. Each of the pairs of the first and second conductor layers includes a first proximity section in which the first and second conductor layers are aligned in an orthogonal direction to an extending direction of the first conductor layer. A distance between the first and second conductor layers in the first proximity section is defined as a proximity distance. Most proximate first and second conductor layers are defined as the first and second conductor layers with a smallest proximity distance and are located on an upper principal surface of a first insulator layer of the one or more insulating layers.

20 Claims, 21 Drawing Sheets

(51) Int. Cl.
    *H05K 1/11*    (2006.01)
    *H05K 3/46*    (2006.01)

(56) References Cited

U.S. PATENT DOCUMENTS

2017/0149111 A1    5/2017  Yosui et al.
2019/0246495 A1    8/2019  Kawazu

FOREIGN PATENT DOCUMENTS

| JP | 2002368346 A | 12/2002 |
| JP | 2010068313 A | 3/2010 |
| JP | 2010186969 A | 8/2010 |
| JP | 2013084842 A | 5/2013 |
| JP | 2013140655 A | 7/2013 |
| JP | 2016092561 A | 5/2016 |
| JP | 6048633 B1 | 12/2016 |
| WO | 2018074100 A1 | 4/2018 |

OTHER PUBLICATIONS

Written Opinion in PCT/JP2021/044203, mailed Mar. 1, 2022, 5 pages.

CIRCUIT BOARD AND METHOD OF MANUFACTURING CIRCUIT BOARD

CROSS REFERENCE TO RELATED APPLICATIONS

This application claims the benefit of priority to Japanese Patent Application No. 2020-202486 filed on Dec. 7, 2020 and is a Continuation application of PCT Application No. PCT/JP2021/044203 filed on Dec. 2, 2021. The entire contents of each application are hereby incorporated herein by reference.

BACKGROUND OF THE INVENTION

1. Field of the Invention

The present invention relates to a circuit board including a substrate body for a circuit including one or more insulator layers.

2. Description of the Related Art

Hitherto, as an invention related to a circuit board, for example, a composite transmission line described in Japanese Patent No. 6048633 is known. This composite transmission line includes a laminated insulator and multiple conductor patterns. The laminated insulator has a structure in which multiple insulator layers are stacked. The multiple conductor patterns are provided on the multiple insulator layers. The multiple conductor patterns form an electric circuit. The multiple conductor patterns are formed, for example, by processing metal foils provided on the multiple insulator layers by photolithography.

In the composite transmission line described in Japanese Patent No. 6048633, multiple conductor patterns provided on an insulator layer may be close to each other. In such a case, high accuracy is required to form the multiple conductor patterns. However, formation of multiple conductor patterns by photolithography has a limit in improving the accuracy of forming the multiple conductor patterns.

SUMMARY OF THE INVENTION

Preferred embodiments of the present invention provide circuit boards that each include a first conductor and a second conductor, which are close to each other and are formed with high accuracy, and methods of manufacturing such circuit boards.

A circuit board according to a preferred embodiment of the present invention includes a substrate body including one or more insulator layers, an upper principal surface, and a lower principal surface with a normal line extending in an up-down direction, and a plurality of conductor layers in or on the substrate body. The plurality of conductor layers include one or more pairs of a first conductor layer and a second conductor layer provided on one of the one or more insulator layers. Each of the one or more pairs of the first conductor layer and the second conductor layer includes a first proximity section in which the first conductor layer and the second conductor layer are aligned in an orthogonal direction orthogonal or substantially orthogonal to an extending direction of the first conductor layer. A distance between the first conductor layer and the second conductor layer in the first proximity section is defined as a proximity distance. The one or more insulator layers includes a first insulator layer. A most proximate first conductor layer and a most proximate second conductor layer are defined as the first and second conductor layers with a smallest proximity distance and are located on an upper principal surface of the first insulator layer. The most proximate first conductor layer includes a first side surface and a second side surface aligned in the orthogonal direction. The most proximate second conductor layer includes a third side surface and a fourth side surface aligned in the orthogonal direction. The first side surface and the third side surface face each other. A first acute angle between the first side surface and the upper principal surface of the first insulator layer is larger than a second acute angle between the second side surface and the upper principal surface of the first insulator layer.

A circuit board according to a preferred embodiment of the present invention includes a substrate body including one or more insulator layers, an upper principal surface, and a lower principal surface with a normal line extending in an up-down direction, and a plurality of conductor layers in or on the substrate body. The one or more insulator layers include a first insulator layer. The plurality of conductor layers include one or more pairs of a first conductor layer and a second conductor layer. The first conductor layer and the second conductor layer are provided on an upper principal surface of the first insulator layer. When viewed in the up-down direction, a first groove is provided in the upper principal surface of the first insulator layer in at least a portion of an area located between the first conductor layer and the second conductor layer. When viewed in the up-down direction, outer edges of the first groove overlap a first overlapping portion defined by a portion of an outer edge of the first conductor layer and a second overlapping portion being a portion of an outer edge of the second conductor layer. An inner surface of the first groove is located under the first overlapping portion and the second overlapping portion. A slope of the inner surface of the first groove changes, at the first overlapping portion, discontinuously downward with respect to a slope of a surface of the first insulator layer with which the first conductor layer is in contact. The inner surface of the first groove extends downward from the first overlapping portion.

A circuit board according to a preferred embodiment of the present invention includes a substrate body including one or more insulator layers, an upper principal surface, and a lower principal surface with a normal line extending in an up-down direction, and a plurality of conductor layers in or on the substrate body. The one or more insulator layers include a first insulator layer. The multiple conductor layers include one or more pairs of a first conductor layer and a second conductor layer. The first conductor layer and the second conductor layer are provided on an upper principal surface of the first insulator layer. When viewed in the up-down direction, a first groove is provided in the upper principal surface of the first insulator layer in at least a portion of an area located between the first conductor layer and the second conductor layer. A surface roughness of an inner surface of the first groove is different from a surface roughness of a surface of the first insulator layer with which the first conductor layer is in contact.

A method of manufacturing a circuit board according to a preferred embodiment of the present invention includes preparing an insulator layer with a metal foil in which a metal foil is provided on an upper principal surface of a first insulator layer including an upper principal surface and a lower principal surface aligned in an up-down direction, after the preparing step, forming a conductor layer from the metal foil by photolithography, and after the pattern forming step, linearly irradiating the conductor layer with a laser beam when viewed in the up-down direction to separate the conductor layer into a first conductor layer and a second conductor layer with an area irradiated with the laser beam interposed between the first conductor layer and the second conductor layer.

According to preferred embodiments of the present invention, the first conductor and the second conductor, which are close to each other, are able to be provided with high accuracy.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred Embodiment

Structure of Circuit Board 10

Figure 1:
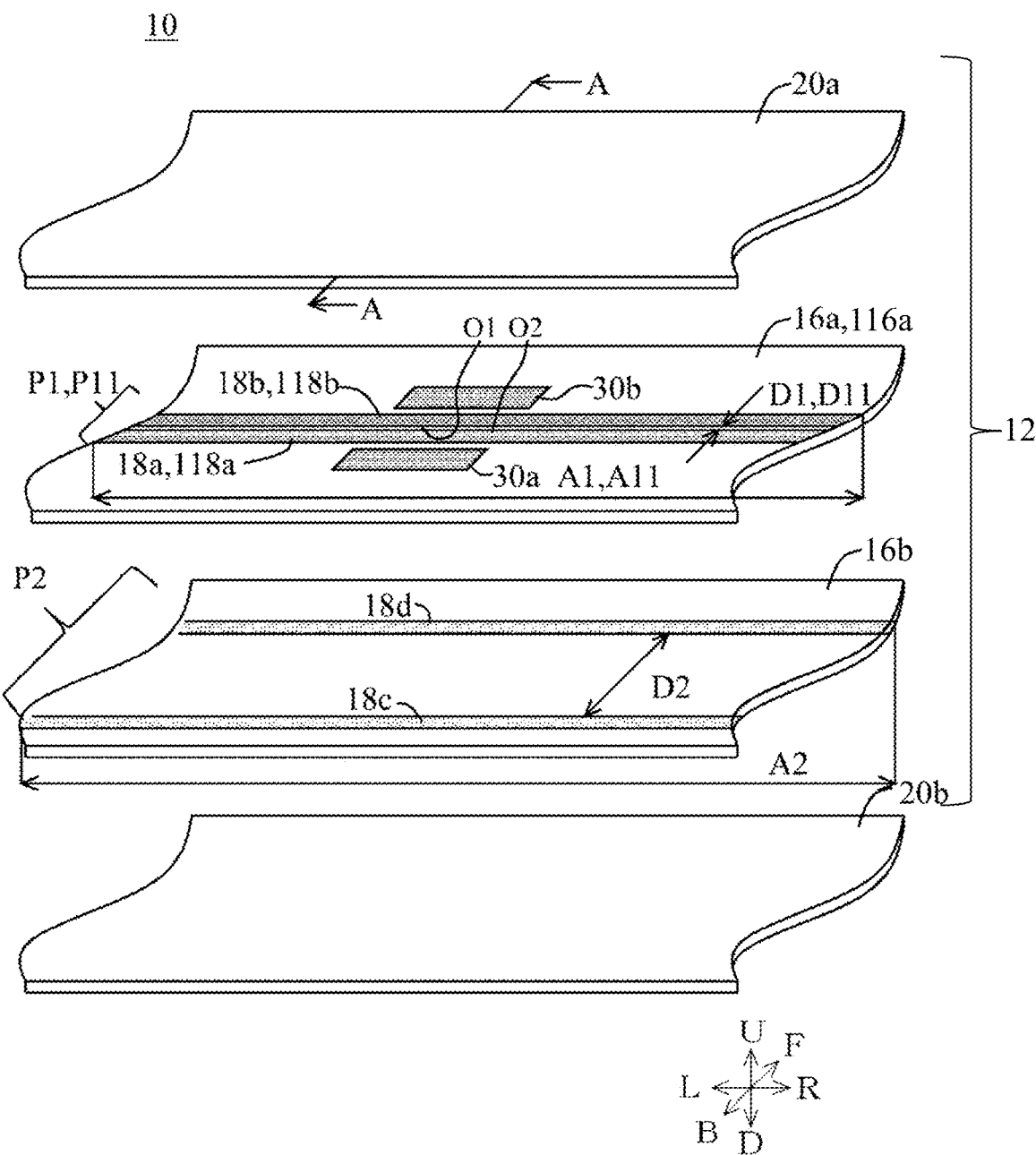
FIG. 1 is an exploded perspective view of a circuit board 10 according to a preferred embodiment of the present invention.

A structure of a circuit board 10 according to a preferred embodiment of the present invention will be described below with reference to the accompanying drawings. FIG. 1 is an exploded perspective view of the circuit board 10.

The circuit board 10 is, for example, a transmission line that transmits a first high-frequency signal to a fourth high-frequency signal. In the circuit board 10, a transmission direction of the first high-frequency signal to the fourth high-frequency signal is defined as a right-left direction. In other words, an extending direction of conductor layers 18a to 18d is defined as the right-left direction. A direction normal to an upper principal surface and a lower principal surface of a substrate body 12 of the circuit board 10 is defined as an up-down direction. The up-down direction and the right-left direction are orthogonal or substantially orthogonal to each other. An orthogonal direction orthogonal or substantially orthogonal to the up-down direction and the right-left direction is defined as a back-forth direction. The up-down direction, the right-left direction, and the back-forth direction of the circuit board 10 do not have to match the up-down direction, the right-left direction, and the back-forth direction of the circuit board 10 in use.

In the following, X is a component or member of the circuit board 10. In this specification, unless otherwise specified, portions of X are defined as follows. A front portion of X means a front half of X. A rear portion of X means a rear half of X. A left portion of X means a left half of X. A right portion of X means a right half of X. An upper portion of X means an upper half of X. A lower portion of X means a lower half of X. A front end of X means an end of X in a front direction. A rear end of X means an end of X in a rear direction. A left end of X means an end of X in a left direction. A right end of X means an end of X in a right direction. An upper end of X means an end of X in an upward direction. A lower end of X means an end of X in a downward direction. A front end portion of X means the front end of X and the vicinity thereof. A rear end portion of X means the rear end of X and the vicinity thereof. A left end portion of X means the left end of X and the vicinity thereof. A right end portion of X means the right end of X and the vicinity thereof. An upper end portion of X means the upper end of X and the vicinity thereof. A lower end portion of X means the lower end of X and the vicinity thereof.

The circuit board 10 includes the substrate body 12, the multiple conductor layers 18a to 18d, and protective layers 20a and 20b. The substrate body 12 has a plate shape. Consequently, the substrate body 12 includes an upper principal surface and a lower principal surface. The direction normal to the upper principal surface and the lower principal surface of the substrate body 12 extends in the up-down direction. The substrate body 12 extends in the right-left direction. The substrate body 12 has flexibility. Thus, the substrate body 12 is used in a bent state.

The substrate body 12 includes one or more insulator layers 16a and 16b. The substrate body 12 has a structure in which the insulator layers 16a and 16b are stacked in this order from top to bottom. The insulator layers 16a and 16b have the same shape as the substrate body 12 when viewed in the up-down direction. A material of the insulator layers 16a and 16b is, for example, a thermoplastic resin. The thermoplastic resin is, for example, a liquid crystal polymer or polyimide. Thus, the insulator layers 16a and 16b have flexibility.

The conductor layers 18a to 18d are provided on the substrate body 12. To be more specific, the conductor layer 18a and the conductor layer 18b are provided on an upper principal surface of the insulator layer 16a. Consequently, the conductor layers 18a to 18d include a pair P1 of the conductor layer 18a (first conductor layer) and the conductor layer 18b (second conductor layer) provided on the insulator layer 16a (first insulator layer). The conductor layer 18a and the conductor layer 18b have a linear shape extending in the right-left direction when viewed in the up-down direction. Thus, the pair P1 of the conductor layer 18a (first conductor layer) and the conductor layer 18b (second conductor layer) include a first proximity section A1 in which the conductor layer 18a (first conductor layer) and the conductor layer 18b (second conductor layer) are aligned in the back-forth direction (orthogonal direction orthogonal or substantially orthogonal to the extending direction of the first conductor layer). In the present preferred embodiment, the conductor layer 18b is located in front of the conductor layer 18a. Hereinafter, a distance between the conductor layer 18a (first conductor layer) and the conductor layer 18b (second conductor layer) in the first proximity section A1 is defined as a proximity distance D1. In the present specification, the proximity distance is an average of distances between two conductor layers in a proximity section. The conductor layer 18a is a signal line that transmits the first high-frequency signal. The conductor layer 18b is a signal line that transmits the second high-frequency signal. Thus, the conductor layer 18a (first conductor layer) and the conductor layer 18b (second conductor layer) are not electrically connected. In this specification, the high-frequency signal is, for example, a signal having a frequency of several GHz or higher.

The conductor layer 18c and the conductor layer 18d are provided on a lower principal surface of the insulator layer 16b. The conductor layers 18a to 18d include a pair P2 of the conductor layer 18c (first conductor layer) and a conductor layer 18d (second conductor layer) provided on the insulator layer 16b. The conductor layer 18c and the conductor layer 18d have a linear shape extending in the right-left direction when viewed in the up-down direction. The pair P2 of the conductor layer 18c (first conductor layer) and the conductor layer 18d (second conductor layer) includes a first proximity section A2 in which the conductor layer 18c (first conductor layer) and the conductor layer 18d (second conductor layer) are aligned in the back-forth direction (orthogonal direction orthogonal or substantially orthogonal to the extending direction of the first conductor layer). In the present preferred embodiment, the conductor layer 18d is located in front of the conductor layer 18c. Hereinafter, a distance between the conductor layer 18c (first conductor layer) and the conductor layer 18d (second conductor layer) in the first proximity section A2 is defined as a proximity distance D2. The conductor layer 18c is a signal line that transmits the third high-frequency signal. The conductor layer 18d is a signal line that transmits the fourth high-frequency signal. The conductor layer 18c (first conductor layer) and the conductor layer 18d (second conductor layer) are not electrically connected.

The proximity distance D1 is smaller than the proximity distance D2. Thus, the pair P1 of the conductor layer 18a (first conductor layer) and the conductor layer 18b (second conductor layer) having the smallest proximity distance is defined as a pair P11 of a most proximate first conductor layer 118a and a most proximate second conductor layer 118b. The pair P11 of the most proximate first conductor layer 118a and the most proximate second conductor layer 118b has a most proximate section A11 in which the most proximate first conductor layer 118a and the most proximate second conductor layer 118b are aligned in the back-forth direction (orthogonal direction). The proximity distance D1 between the most proximate first conductor layer 118a and the most proximate second conductor layer 118b in the most proximate section A11 (first proximity section A1) is defined as a first most proximate inter-conductor distance D11.

The insulator layer 16a on which the most proximate first conductor layer 118a and the most proximate second conductor layer 118b are provided is defined as a first insulator layer 116a. The most proximate first conductor layer 118a (first conductor layer) and the most proximate second conductor layer 118b (second conductor layer) are provided on an upper principal surface of the first insulator layer 116a. Thus, the insulator layers 16a and 16b include the first insulator layer 116a.

Figure 2:
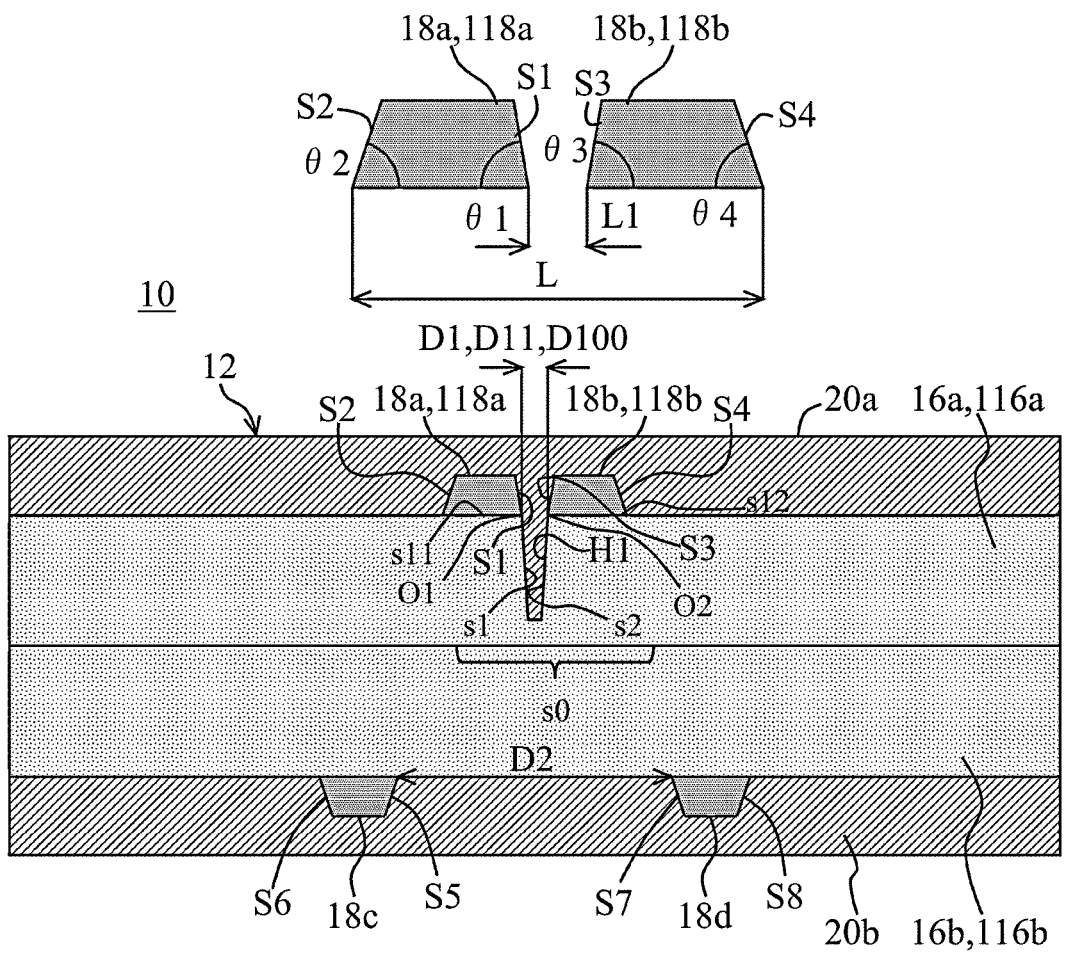
FIG. 2 is a sectional view of the circuit board 10 taken along line A-A in FIG. 1.

Next, a sectional structure of the circuit board 10 will be described with reference to FIG. 2. FIG. 2 is a sectional view of the circuit board 10 taken along line A-A in FIG. 1. The most proximate first conductor layer 118a has a first side surface S1 and a second side surface S2 aligned in the back-forth direction (orthogonal direction). The first side surface S1 is a front surface of the most proximate first conductor layer 118a. The second side surface S2 is a rear surface of the most proximate first conductor layer 118a. The most proximate second conductor layer 118b has a third side surface S3 and a fourth side surface S4 aligned in the back-forth direction (orthogonal direction). The third side surface S3 is a rear surface of the most proximate second conductor layer 118b. The fourth side surface S4 is a front surface of the most proximate second conductor layer 118b. Consequently, the first side surface S1 and the third side surface S3 face each other.

A first acute angle θ1 between the first side surface S1 and the upper principal surface of the first insulator layer 116a is larger than a second acute angle θ2 between the second side surface S2 and the upper principal surface of the first insulator layer 116a. A third acute angle θ3 between the third side surface S3 and the upper principal surface of the first insulator layer 116a is larger than a fourth acute angle θ4 between the fourth side surface S4 and the upper principal surface of the first insulator layer 116a.

The conductor layer 18c includes a fifth side surface S5 and a sixth side surface S6 aligned in the back-forth direction (orthogonal direction). The fifth side surface S5 is a front surface of the conductor layer 18c. The sixth side surface S6 is a rear surface of the conductor layer 18c. The conductor layer 18d includes a seventh side surface S7 and an eighth side surface S8 aligned in the back-forth direction (orthogonal direction). The seventh side surface S7 is a rear surface of the conductor layer 18d. The eighth side surface S8 is a front surface of the conductor layer 18d. Consequently, the fifth side surface S5 and the seventh side surface S7 face each other.

A fifth acute angle θ5 between the fifth side surface S5 and the lower principal surface of the insulator layer 16b is equal or substantially equal to a sixth acute angle θ6 between the sixth side surface S6 and the lower principal surface of the insulator layer 16b. A seventh acute angle θ7 between the seventh side surface S7 and the lower principal surface of the insulator layer 16b is equal or substantially equal to an eighth acute angle θ8 formed by the eighth side surface S8 and the lower principal surface of the insulator layer 16b.

As illustrated in FIG. 2, when viewed in the up-down direction, in at least a portion of an area located between the conductor layer 18a (first conductor layer) and the conductor layer 18b (second conductor layer), a first groove H1 is provided in the upper principal surface of the first insulator layer 116a. To be more specific, when viewed in the up-down direction, in at least a portion of an area located between the most proximate first conductor layer 118a and the most proximate second conductor layer 118b in the most proximate section A11 (first proximity section A1) in the first insulator layer 116a, the first groove H1 is provided in the upper principal surface of the first insulator layer 116a. The first groove H1 extends along the most proximate first conductor layer 118a and the most proximate second conductor layer 118b over an entire or substantially an entire length of the most proximate section A11 when viewed in the up-down direction. Consequently, the first groove H1 is a groove extending in the right-left direction when viewed in the up-down direction.

The first groove H1 has a tapered shape in which a width in the back-forth direction increases from a bottom surface of the first groove H1 upward when viewed in the right-left direction. However, the first groove H1 is different from a recess provided by, for example, undulating the first insulator layer 116a in the up-down direction when thermocompression bonding the substrate body 12. Thus, the first groove H1 has a structure described below.

When viewed in the up-down direction, outer edges of the first groove H1 overlap a first overlapping portion O1, which is a portion of an outer edge of the most proximate first conductor layer 118a, and a second overlapping portion O2, which is a portion of an outer edge of the most proximate second conductor layer 118b. The outer edges of the first groove H1 are a rear side and a front side of the first groove H1 when viewed in the up-down direction. The outer edges of the first groove H1 are portions of an inner surface s0 of the first groove H1. The first overlapping portion O1 is a front side of the most proximate first conductor layer 118a when viewed in the up-down direction. The second overlapping portion O2 is a rear side of the most proximate second conductor layer 118b when viewed in the up-down direction. The inner surface s0 of the first groove H1 is located under the first overlapping portion O1 and the second overlapping portion O2. The inner surface s0 includes inner surfaces s1 and s2. The inner surface s1 is a rear portion of the inner surface s0 of the first groove H1. The inner surface s2 is a front portion of the inner surface s0 of the first groove H1. A slope of the inner surface s1 of the first groove H1 changes, at the first overlapping portion O1, discontinuously downward with respect to a slope of a surface s11 of the first insulator layer 116a with which the most proximate first conductor layer 118a is in contact. Thus, the inner surface s1 is bent at the first overlapping portion O1. The inner surface s1 of the first groove H1 extends downward from the first overlapping portion O1. A slope of the inner surface s2 of the first groove H1 changes, at the second overlapping portion O2, discontinuously downward with respect to a slope of a surface s12 of the first insulator layer 116a with which the most proximate second conductor layer 118b is in contact. Thus, the inner surface s2 is bent at the second overlapping portion O2. The inner surface s2 of the first groove H1 extends downward from the second overlapping portion O2. A slope of a surface is an angle between the surface and the up-down direction.

Here, determination of discontinuity in this specification will be described. First, the section in FIG. 2 is observed at a magnification of 100 times. At this time, an angle between a surface extending the surface s11 of the first insulator layer 116a with which the most proximate first conductor layer 118a is in contact and a surface extending the inner surface s1 is measured. When this angle is, for example, about 30 degrees or less, the slope of the surface s11 and the slope of the inner surface s1 change continuously. When this angle is larger than about 30 degrees, the slope of the surface s11 and the slope of the inner surface s1 change discontinuously.

A surface roughness of the inner surface s1 of the first groove H1 is different from a surface roughness of the surface s11 of the first insulator layer 116a with which the most proximate first conductor layer 118a (conductor layer 18a) is in contact. Similarly, surface roughness of the inner surface s2 of the first groove H1 is different from surface roughness of the surface s12 of the first insulator layer 116a with which the most proximate second conductor layer 118b (conductor layer 18b) is in contact. Surface roughness is measured according to JIS B 0601:1994. A maximum height Ry is then used as the surface roughness. A lower limit of a reference length is, for example, about 10 μm. In the present specification, surface roughness of a first surface being different from surface roughness of a second surface is as follows. Ry1 is maximum surface roughness of the first surface. Ry2 is maximum surface roughness of the second surface. Ry1<Ry2. At this time, if Ry1×0.1 Ry2−Ry1 is satisfied, the surface roughness of the first surface is different from the surface roughness of the second surface.

A maximum value D100 of the width of the first groove H1 in the back-forth direction (orthogonal direction) is equal to or greater than the first most proximate inter-conductor distance D11. The width of the first groove H1 in the back-forth direction (orthogonal direction) has the maximum value D100 at an upper end of the first groove H1. In the present preferred embodiment, the maximum value D100 of the width of the first groove H1 in the back-forth direction is equal or substantially equal to the first most proximate inter-conductor distance D11. Consequently, the first side surface S1 and the inner surface of the first groove H1 are continuously connected. The third side surface S3 and the inner surface s0 of the first groove H1 are continuously connected. That is, the upper principal surface of the first insulator layer 116a is not visible between the first side surface S1 and the inner surface s0 of the first groove H1. The upper principal surface of the first insulator layer 116a is not visible between the third side surface S3 and the inner surface s0 of the first groove H1.

A lower end of the first groove H1 is located above a lower principal surface of the first insulator layer 116a. Consequently, a depth of the first groove H1 is smaller than a thickness of the first insulator layer 116a.

The protective layer 20a covers the upper principal surface of the substrate body 12. In the present preferred embodiment, the protective layer 20a covers the upper principal surface of the first insulator layer 116a. The protective layer 20a is, for example, a resist layer or a coverlay layer. A dielectric constant of the protective layer 20a is lower than a dielectric constant of the first insulator layer 116a. Thus, the first groove H1 is filled with an insulating material having a dielectric constant lower than that of the first insulator layer 116a.

The protective layer 20b covers the lower principal surface of the substrate body 12. In the present preferred embodiment, the protective layer 20b covers the lower principal surface of the insulator layer 16b. The protective layer 20b is, for example, a resist layer or a coverlay layer.

The conductor layers 18a to 18d as described above are formed by patterning a metal foil attached to the upper principal surface of the insulator layer 16a or the lower principal surface of the insulator layer 16b. The metal foil is, for example, a copper foil. The patterning is performed by combining photolithography and laser beam irradiation, for example. To be specific, the second side surface S2, the fourth side surface S4, the fifth side surface S5, the sixth side surface S6, the seventh side surface S7, and the eighth side surface S8 are formed by, for example, photolithography. The first side surface S1 and the third side surface S3 are formed by, for example, laser beam irradiation. The first groove H1 is formed in the upper principal surface of the first insulator layer 116a (insulator layer 16a) by, for example, laser beam irradiation. Further, the laser beam irradiation makes the first acute angle θ1 and the third acute angle θ3 larger than the second acute angle θ2, the fourth acute angle θ4, the fifth acute angle θ5, the sixth acute angle θ6, the seventh acute angle θ7, and the eighth acute angle θ8.

Advantageous Effects

According to the circuit board 10, the most proximate first conductor layer 118a (conductor layer 18a) and the most proximate second conductor layer 118b (conductor layer 18b), which are close to each other, can be positioned with high accuracy. To be more specific, when viewed in the up-down direction, in at least a portion of the area located between the conductor layer 18a and the conductor layer 18b, the first groove H1 is provided in the upper principal surface of the first insulator layer 116a. That is, when viewed in the up-down direction, in at least a portion of the area located between the most proximate first conductor layer 118a and the most proximate second conductor layer 118b in the most proximate section A11 (first proximity section A1) in the first insulator layer 116a, the first groove H1 is provided in the upper principal surface of the first insulator layer 116a. Thus, on the circuit board 10, laser beam irradiation is performed to separate the most proximate first conductor layer 118a and the most proximate second conductor layer 118b. As a result, the most proximate first conductor layer 118a and the most proximate second conductor layer 118b can be separated from each other while the most proximate first conductor layer 118a and the most proximate second conductor layer 118b are in close proximity to each other. As described above, according to the circuit board 10, the most proximate first conductor layer 118a (conductor layer 18a) and the most proximate second conductor layer 118b (conductor layer 18b), which are close to each other, can be positioned with high accuracy.

The fact that the first groove H1 is formed by laser beam irradiation can be confirmed, for example, by the fact that the surface roughness of the inner surface s0 of the first groove H1 is different from the surface roughness of the surface s11 of the first insulator layer 116a with which the most proximate first conductor layer 118a is in contact.

According to the circuit board 10, the conductor layers 18a to 18d can be formed in a short time. For example, in forming the conductor layers 18a to 18d, laser beam irradiation may be performed without performing photolithography. However, in this case, all of the side surfaces of the conductor layers 18a to 18d need to be formed by laser beam irradiation. Thus, a time required to form the conductor layers 18a to 18d is longer. In the circuit board 10, the first acute angle θ1 and the third acute angle θ3 are larger than the second acute angle θ2, the fourth acute angle θ4, the fifth acute angle θ5, the sixth acute angle θ6, the seventh acute angle θ7, and the eighth acute angle θ8. That is, the second side surface S2, the fourth side surface S4, the fifth side surface S5, the sixth side surface S6, the seventh side surface S7, and the eighth side surface S8 are formed by photolithography, for example. The first side surface S1 and the third side surface S3 are formed by, for example, laser beam irradiation. In the photolithography step, the second side surface S2, the fourth side surface S4, the fifth side surface S5, the sixth side surface S6, the seventh side surface S7, and the eighth side surface S8 can be simultaneously formed in a short time. Consequently, by combining laser beam irradiation and photolithography, the conductor layers 18a to 18d can be formed in a short time.

According to the circuit board 10, a decrease in strength of the insulator layers 16a and 16b can be reduced or prevented. To be more specific, for example, in forming the conductor layers 18a to 18d, the laser beam irradiation may be performed without performing photolithography. However, in this case, all of the side surfaces of the conductor layers 18a to 18d need to be formed by laser beam irradiation. Thus, grooves are formed near the conductor layers 18a to 18d in the upper principal surface of the insulator layer 16a and the lower principal surface of the insulator layer 16b. Formation of such grooves leads to a decrease in strength of the insulator layers 16a and 16b. In the circuit board 10, the first acute angle θ1 and the third acute angle θ3 are larger than the second acute angle θ2, the fourth acute angle θ4, the fifth acute angle θ5, the sixth acute angle θ6, the seventh acute angle θ7, and the eighth acute angle θ8. That is, the second side surface S2, the fourth side surface S4, the fifth side surface S5, the sixth side surface S6, the seventh side surface S7, and the eighth side surface S8 are formed by photolithography. The first side surface S1 and the third side surface S3 are formed by laser beam irradiation. In the photolithography step, no grooves are formed in the upper principal surface of the insulator layer 16a and the lower principal surface of the insulator layer 16b. Consequently, by combining laser beam irradiation and photolithography, a decrease in strength of the insulator layers 16a and 16b can be reduced or prevented.

Figure 3:
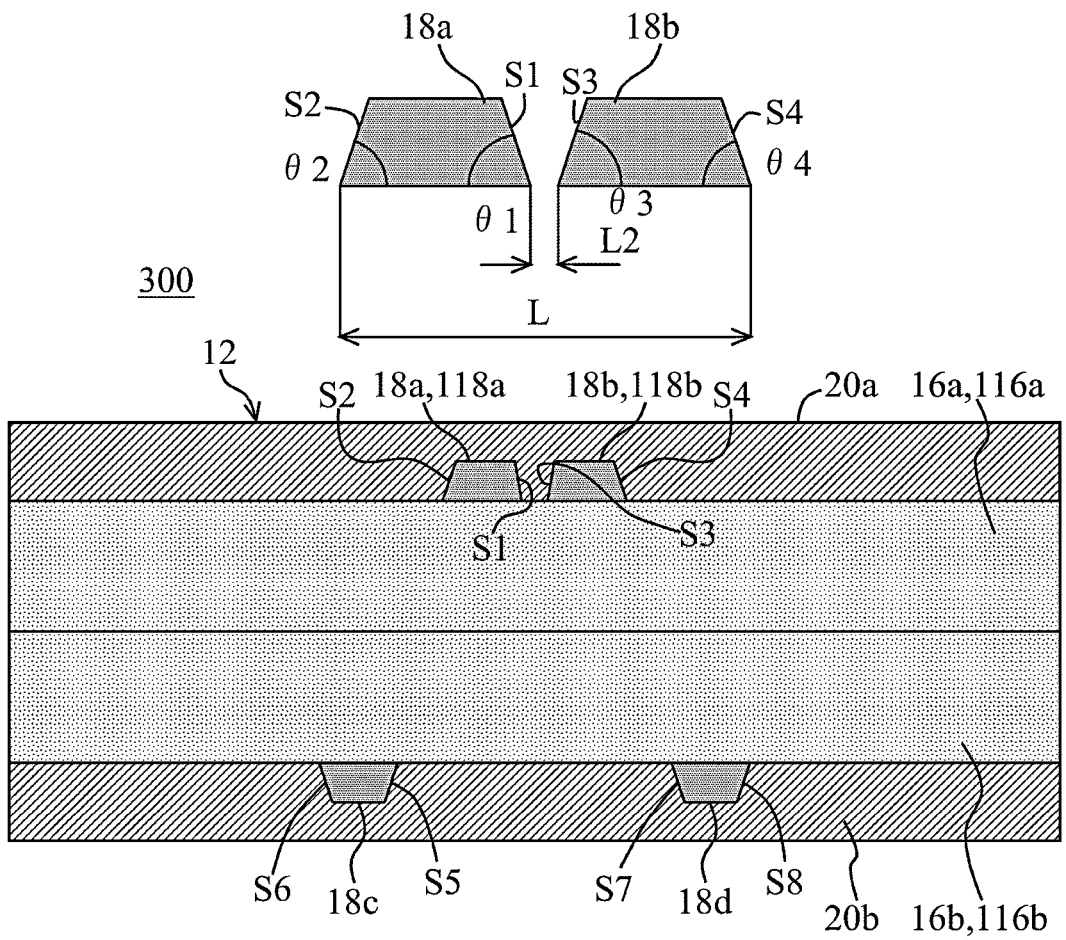
FIG. 3 is a sectional view of a circuit board 300 of a comparative example.
Figure 3:
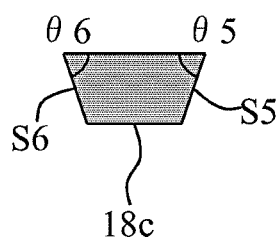
Figure 3:
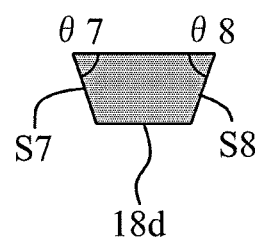
Figure 3:
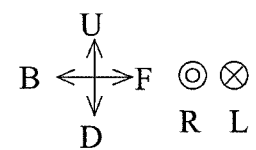

FIG. 3 is a sectional view of a circuit board 300 of a comparative example. The circuit board 300 differs from the circuit board 10 in that the first acute angle θ1 and the third acute angle θ3 are equal or substantially equal to the second acute angle θ2, the fourth acute angle θ4, the fifth acute angle θ5, the sixth acute angle θ6, the seventh acute angle θ7, and the eighth acute angle θ8 and that the first groove H1 is not provided. The first acute angle θ1 and the third acute angle θ3 in the circuit board 10 are larger than the first acute angle θ1 and the third acute angle θ3 in the circuit board 300. Thus, in the circuit board 10, a distance between the conductor layer 18a and the conductor layer 18b can be narrower. When the first groove H1 is empty or when the first groove H1 is filled with a low dielectric constant material, an increase in a capacitance due to the narrow distance between the conductor layer 18a and the conductor layer 18b can be reduced or prevented.

In the circuit board 10, the first groove H1 is filled with the insulating material having a dielectric constant lower than that of the first insulator layer 116a. This reduces capacitance generated between the conductor layer 18a and the conductor layer 18b.

First Modification

Structure of Circuit Board 10a

Figure 4:
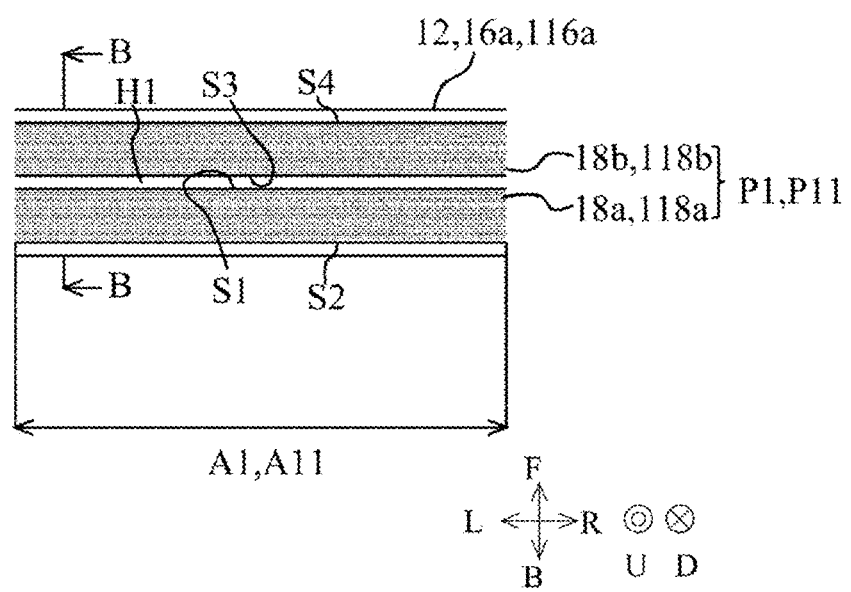
FIG. 4 is a top view of a circuit board 10a according to a preferred embodiment of the present invention.
Figure 5:
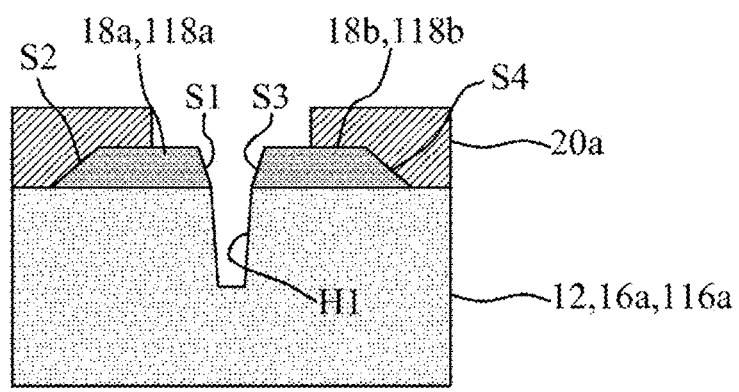
FIG. 5 is a sectional view of the circuit board 10a taken along line B-B.
Figure 5:
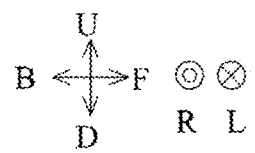

A structure of a circuit board 10a according to a first modification of a preferred embodiment of the present invention will be described below. FIG. 4 is a top view of the circuit board 10a. FIG. 5 is a sectional view of the circuit board 10a taken along line B-B. In FIG. 4, the protective layer 20a is omitted.

The circuit board 10a differs from the circuit board 10 in the following points.

The circuit board 10a does not include the insulator layer 16b, the conductor layers 18c and 18d, and the protective layer 20b.

The protective layer 20a partially covers both of the conductor layers 18a and 18b.

To be more specific, the substrate body 12 includes one insulator layer 16a. The substrate body 12 is, for example, a laminated substrate made of a thermoplastic resin such as a liquid crystal polymer. Alternatively, for example, the substrate body 12 may be a laminated substrate made of a glass epoxy resin in which glass cloth is solidified with an epoxy resin. The multiple conductor layers 18a and 18b include the pair P1 of the conductor layer 18a (first conductor layer) and the conductor layer 18b (second conductor layer) provided on the upper principal surface of the insulator layer 16a. The circuit board 10a includes only one pair of the first conductor layer and the second conductor layer provided on the insulator layer. Consequently, a pair of the first conductor layer and the second conductor layer having the smallest proximity distance is the pair P1 of the conductor layer 18a (first conductor layer) and the conductor layer 18b (second conductor layer). Thus, the pair P1 of the conductor layer 18a (first conductor layer) and the conductor layer 18b (second conductor layer) is defined as the pair P11 of the most proximate first conductor layer 118a and the most proximate second conductor layer 118b.

The most proximate first conductor layer 118a and the most proximate second conductor layer 118b are provided on the upper principal surface of the insulator layer 16a. Thus, the insulator layer 16a is defined as the first insulator layer 116a. When viewed in the up-down direction, in at least a portion of an area located between the most proximate first conductor layer 118a and the most proximate second conductor layer 118b in the first proximity section A1 in the first insulator layer 116a, the first groove H1 is provided in the upper principal surface of the first insulator layer 116a. The most proximate first conductor layer 118a and the most proximate second conductor layer 118b are not physically connected.

The protective layer 20a is provided on the upper principal surface of the first insulator layer 116a. The protective layer 20a covers the second side surface S2 and the fourth side surface S4 and does not cover the first side surface S1 or the third side surface S3. Thus, the first groove H1 is not filled with an insulating material. That is, the inside of the first groove H1 is empty. Since other structures of the circuit board 10a are the same or substantially the same as those of the circuit board 10, description thereof will be omitted.

Method of Manufacturing Circuit Board 10a

Figure 6:
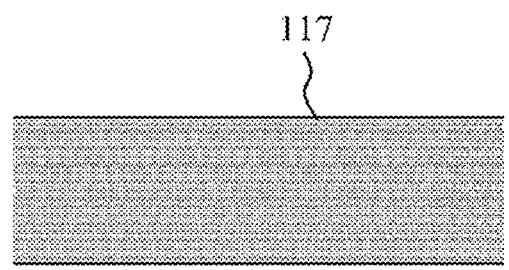
FIG. 6 is a top view of the circuit board 10a during manufacturing.
Figure 6:
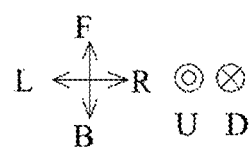
Figure 7:
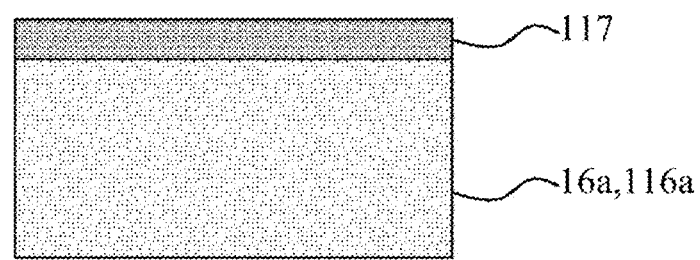
FIG. 7 is a sectional view of the circuit board 10a during manufacturing.
Figure 7:
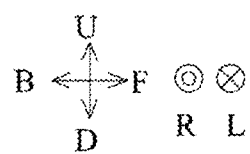
Figure 8:
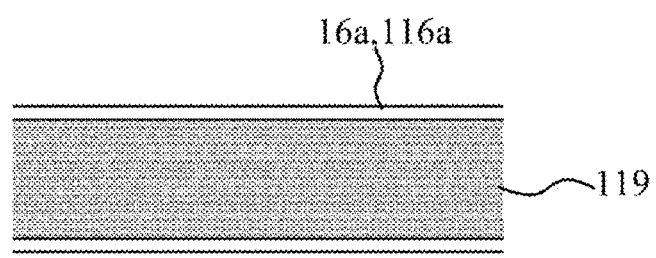
FIG. 8 is a top view of the circuit board 10a during manufacturing.
Figure 8:
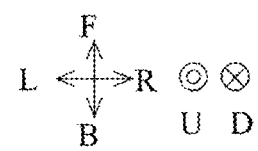
Figure 9:
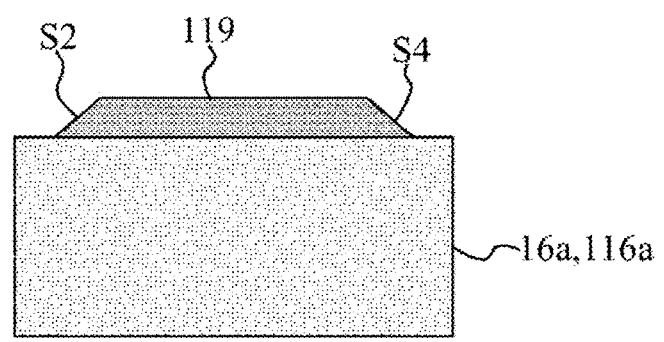
FIG. 9 is a sectional view of the circuit board 10a during manufacturing.
Figure 9:
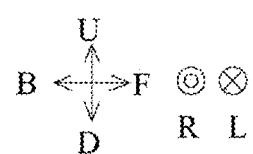
Figure 10:
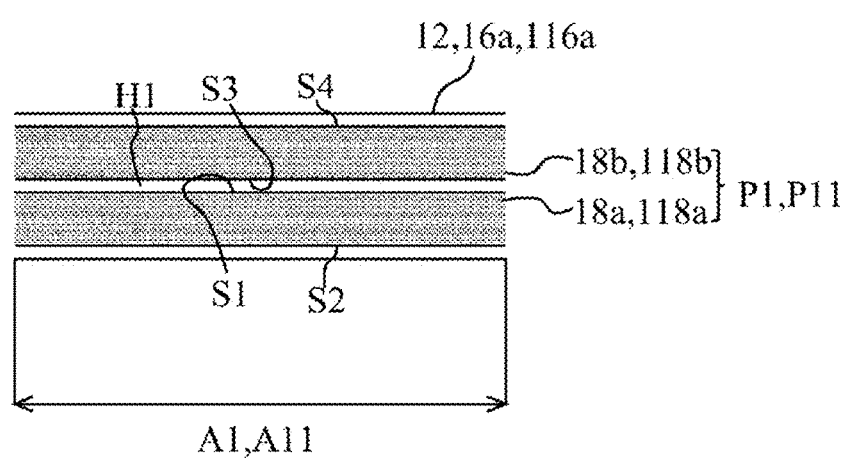
FIG. 10 is a top view of the circuit board 10a during manufacturing.
Figure 10:
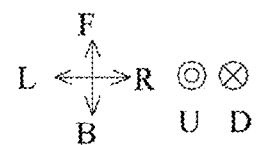
Figure 11:
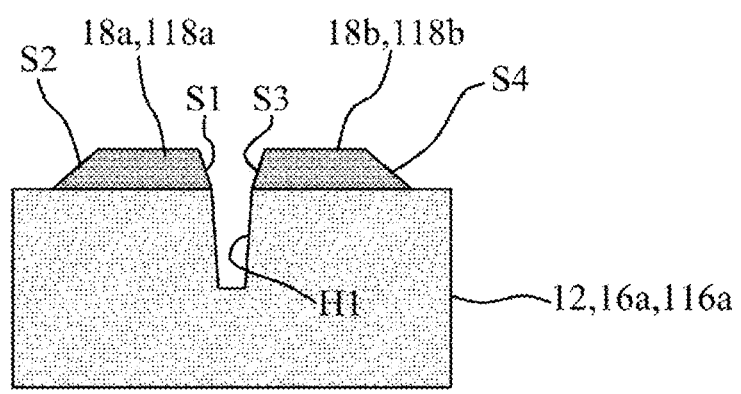
FIG. 11 is a sectional view of the circuit board 10a during manufacturing.
Figure 11:
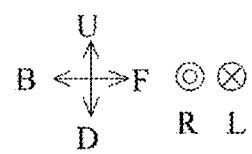

Next, a non-limiting example of a method of manufacturing the circuit board 10a will be described with reference to the accompanying drawings. FIGS. 6, 8, and 10 are top views of the circuit board 10a during manufacture. FIGS. 7, 9, and 11 are sectional views of the circuit board 10a during manufacture. In an actual method of manufacturing the circuit board 10a, multiple circuit boards 10a are manufactured at the same time by cutting a large-sized first insulator layer 116a. However, the method of manufacturing one circuit board 10a will be described below.

As illustrated in FIGS. 6 and 7, an insulator layer with a metal foil is prepared (preparing step) in which a metal foil 117 is provided on the upper principal surface of the first insulator layer 116a including the upper principal surface and the lower principal surface aligned in the up-down direction. The metal foil 117 is, for example, a copper foil. The metal foil 117 covers the entire or substantially the entire upper principal surface of the first insulator layer 116a.

After the preparing step, as illustrated in FIGS. 8 and 9, photolithography is performed on the metal foil 117 to form a conductor layer 119 (pattern forming step). In the pattern forming step, a mask having an outer shape along the second side surface S2 and the fourth side surface S4 is formed on the metal foil 117. Then, the metal foil 117 is etched using the mask. An etchant is, for example, an aqueous iron chloride solution. This forms the second side surface S2 and the fourth side surface S4. However, in the pattern forming step, the first side surface S1 and the third side surface S3 are not formed. Consequently, the conductor layer 119 has a shape in which the conductor layer 18a and the conductor layer 18b are connected as one.

After the pattern forming step, as illustrated in FIGS. 10 and 11, the conductor layer 119 is linearly irradiated with a laser beam when viewed in the up-down direction to separate the conductor layer 119 into the conductor layer 18a (first conductor layer) and the conductor layer 18b (second conductor layer) with the area linearly irradiated with the laser beam interposed therebetween (beam irradiation step). The laser beam is, for example, a UV laser beam. In the beam irradiation step, the first groove H1 is formed in the upper principal surface of the first insulator layer 116a. The lower end of the first groove H1 does not extend to the lower principal surface of the first insulator layer 116a. The lower end of the first groove H1 is located above the lower principal surface of the first insulator layer 116a.

After the beam irradiation step, as illustrated in FIGS. 4 and 5, the protective layer 20a is formed on the upper principal surface of the first insulator layer 116a. Through the above steps, the circuit board 10a is completed.

Advantageous Effects

According to the circuit board 10a, the most proximate first conductor layer 118a (conductor layer 18a) and the most proximate second conductor layer 118b (conductor layer 18b), which are close to each other, can be formed with high accuracy for the same reason as for the circuit board 10. According to the circuit board 10a, the conductor layers 18a and 18b can be formed in a short time for the same reason as for the circuit board 10. According to the circuit board 10a, a decrease in strength of the insulator layer 16a can be reduced or prevented for the same reason as for the circuit board 10. According to the circuit board 10a, capacitance generated between the conductor layer 18a and the conductor layer 18b can be reduced for the same reason as for the circuit board 10.

In the circuit board 10a, the protective layer 20a covers the second side surface S2 and the fourth side surface S4 and does not cover the first side surface S1 or the third side surface S3. Thus, the first groove H1 is not filled with an insulating material. The inside of the first groove H1 is empty. Consequently, an increase in the dielectric constant in the first groove H1 can be reduced or prevented. This reduces the capacitance generated between the conductor layer 18a and the conductor layer 18b.

According to the above-described method of manufacturing the circuit board 10a, in the beam irradiation step, the first groove H1 is formed in the first insulator layer 116a. The lower end of the first groove H1 does not extend to the lower principal surface of the first insulator layer 116a. This suppresses misalignment between the conductor layer 18a and the conductor layer 18b.

Second Modification

Figure 12:
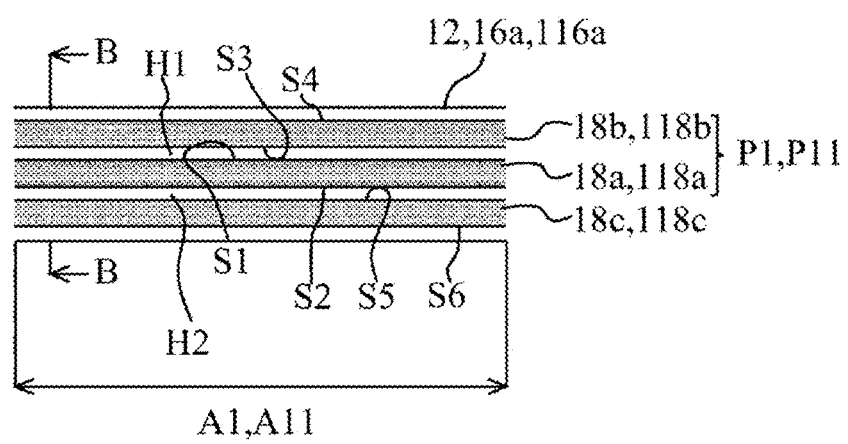
FIG. 12 is a top view of a circuit board 10b according to a preferred embodiment of the present invention.
Figure 12:
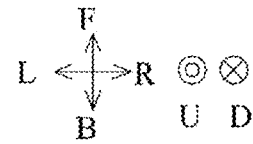
Figure 13:
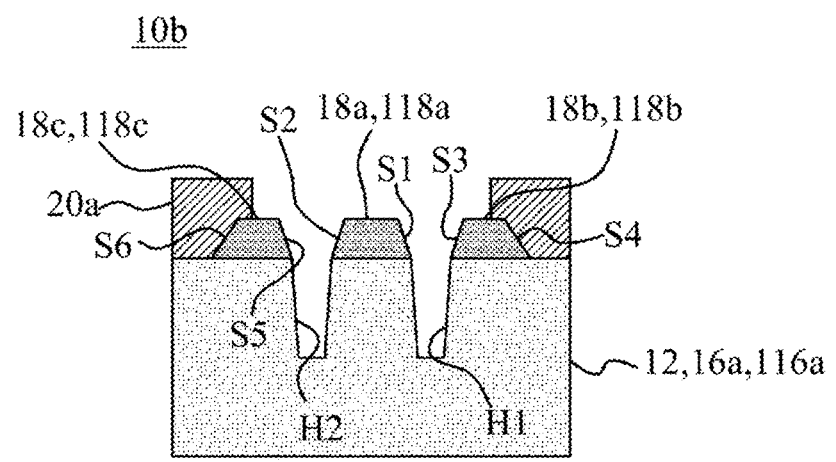
FIG. 13 is a sectional view of the circuit board 10b taken along line B-B.
Figure 13:
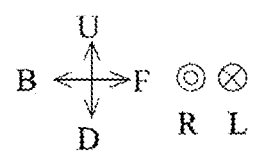

A structure of a circuit board 10b according to a second modification of a preferred embodiment of the present invention will be described below. FIG. 12 is a top view of the circuit board 10b. FIG. 13 is a sectional view of the circuit board 10b taken along line B-B. In FIG. 12, the protective layer 20a is omitted.

The circuit board 10b differs from the circuit board 10a in that the circuit board 10b has a coplanar structure. To be more specific, the circuit board 10b further includes a most proximate third conductor layer 118c (conductor layer 18c). The most proximate third conductor layer 118c is provided on the upper principal surface of the first insulator layer 116a. The most proximate third conductor layer 118c has a linear shape extending in the right-left direction.

The pair P11 of the most proximate first conductor layer 118a and the most proximate second conductor layer 118b includes the most proximate section A11 in which the most proximate first conductor layer 118a and the most proximate second conductor layer 118b are aligned in the back-forth direction (orthogonal direction). The most proximate first conductor layer 118a is provided between the most proximate second conductor layer 118b and the most proximate third conductor layer 118c in the back-forth direction (orthogonal direction) in the most proximate section A11. That is, the most proximate second conductor layer 118b is located in front of the most proximate first conductor layer 118a. The most proximate third conductor layer 118c is located behind the most proximate first conductor layer 118a.

The most proximate second conductor layer 118b and the most proximate third conductor layer 118c are connected to ground potential. That is, the most proximate second conductor layer 118b and the most proximate third conductor layer 118c are ground conductor layers.

When viewed in the up-down direction, in an area located between the most proximate first conductor layer 118a and the most proximate third conductor layer 118c in the most proximate section A11 in the first insulator layer 116a, a second groove H2 is provided in the upper principal surface of the first insulator layer 116a. Since a shape of the second groove H2 is the same as the shape of the first groove H1, description thereof is omitted.

The protective layer 20a is provided on the upper principal surface of the first insulator layer 116a. The protective layer 20a covers the fourth side surface S4 and the sixth side surface S6 and does not cover the first side surface S1, the second side surface S2, the third side surface S3, or the fifth side surface S5. Thus, the first groove H1 and the second groove H2 are not filled with an insulating material. That is, the inside of the first groove H1 and the inside of the second groove H2 are empty. Since other structures of the circuit board 10b are the same as those of the circuit board 10a, description thereof will be omitted.

According to the circuit board 10b, the most proximate first conductor layer 118a (conductor layer 18a), the most proximate second conductor layer 118b (conductor layer 18b), and the most proximate third conductor layer 118c (conductor layer 18c), which are close to each other, can be provided with high accuracy for the same reason as for the circuit board 10a. According to the circuit board 10b, the most proximate first conductor layer 118a, the most proximate second conductor layer 118b, and the most proximate third conductor layer 118c can be formed in a short time for the same reason as for the circuit board 10a. According to the circuit board 10b, a decrease in strength of the insulator layer 16a can be reduced or prevented for the same reason as for the circuit board 10a. According to the circuit board 10b, capacitance generated between the most proximate first conductor layer 118a and the most proximate second conductor layer 118b and capacitance generated between the most proximate first conductor layer 118a and the most proximate third conductor layer 118c can be reduced for the same reason as for the circuit board 10a.

Third Modification

Figure 14:
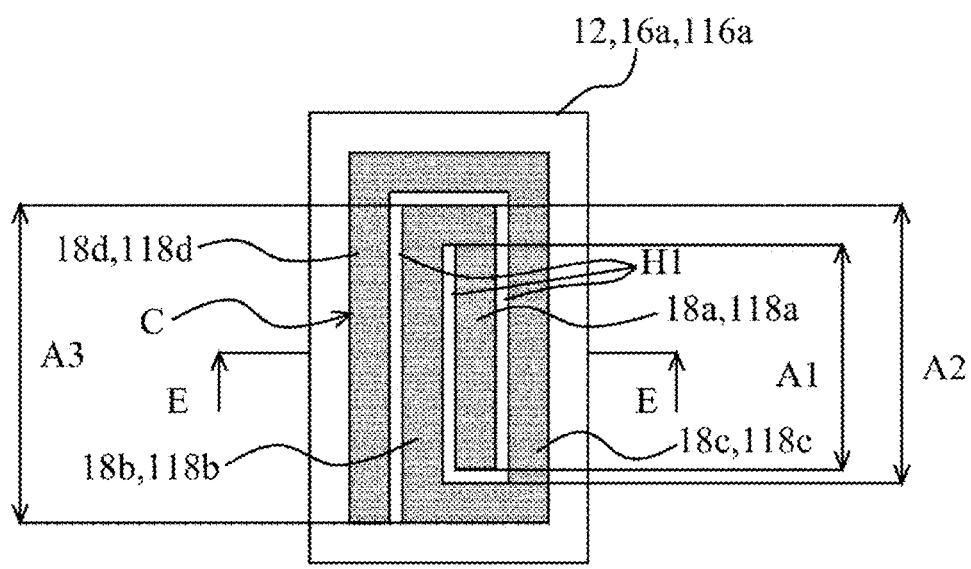
FIG. 14 is a top view of a circuit board 10c according to a preferred embodiment of the present invention.
Figure 14:
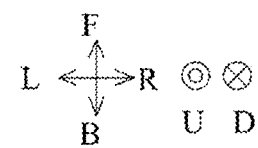
Figure 15:
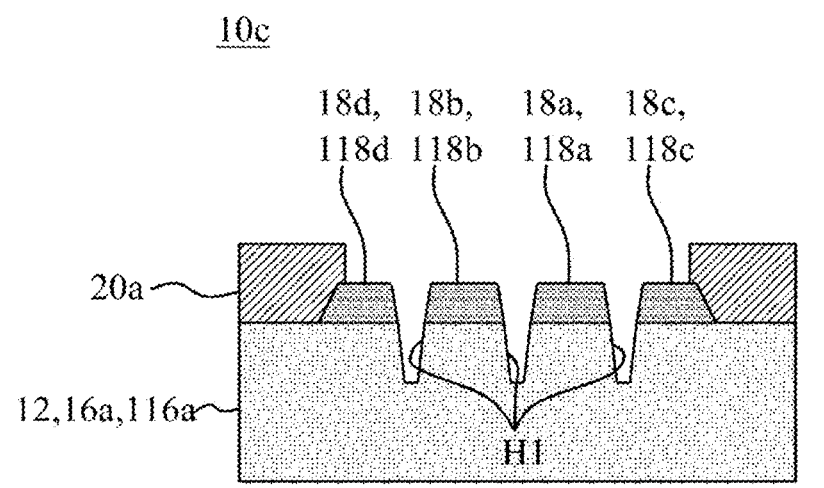
FIG. 15 is a sectional view of the circuit board 10c taken along line E-E.
Figure 15:
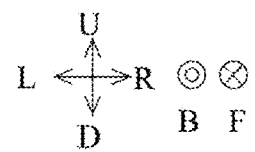

A structure of a circuit board 10c according to a third modification of a preferred embodiment of the present invention will be described below. FIG. 14 is a top view of the circuit board 10c. FIG. 15 is a sectional view of the circuit board 10c taken along line E-E. In FIG. 14, the protective layer 20a is omitted.

The circuit board 10c differs from the circuit board 10a in that the conductor layers 18a to 18d define a coil C. To be more specific, the circuit board 10c includes the conductor layers 18a to 18d. The conductor layers 18a to 18d are provided on the upper principal surface of the first insulator layer 116a. The conductor layers 18a to 18d have linear shapes extending in the back-forth direction. The conductor layer 18d, the conductor layer 18b, the conductor layer 18a, and the conductor layer 18c are aligned in this order from left to right. The conductor layers 18a to 18d are electrically connected. To be more specific, the conductor layer 18d, the conductor layer 18b, the conductor layer 18a, and the conductor layer 18c are electrically connected in series in this order to define the coil C having a spiral shape when viewed in the up-down direction.

Here, the conductor layer 18a is the most proximate first conductor layer 118a. The conductor layer 18b is the most proximate second conductor layer 118b. The conductor layer 18c is the most proximate third conductor layer 118c. The conductor layer 18d is a most proximate fourth conductor layer 118d. When viewed in the up-down direction, in at least a portion of an area located between the most proximate first conductor layer 118a and the most proximate second conductor layer 118b in the first proximity section A1 in the first insulator layer 116a, the first groove H1 is provided in the upper principal surface of the first insulator layer 116a. When viewed in the up-down direction, in at least a portion of an area located between the most proximate first conductor layer 118a and the most proximate third conductor layer 118c in the first proximity section A2 in the first insulator layer 116a, the first groove H1 is provided in the upper principal surface of the first insulator layer 116a. When viewed in the up-down direction, in at least a portion of an area located between the most proximate second conductor layer 118b and the most proximate fourth conductor layer 118d in a first proximity section A3 in the first insulator layer 116a, the first groove H1 is provided in the upper principal surface of the first insulator layer 116a. Further, the three first grooves H1 extending in the front-back direction are connected by the two first grooves H1 extending in the front-back direction. Thus, when viewed in the up-down direction, the first grooves H1 define a spiral shape along the most proximate first conductor layer 118a, the most proximate second conductor layer 118b, the most proximate third conductor layer 118c, and the most proximate fourth conductor layer 118d. As described above, in the circuit board 10c, the spiral shape is provided by the first grooves H1 in a rectangular or substantially rectangular conductor layer, thus providing the spiral-shaped coil C. Since other structures of the circuit board 10c are the same or substantially the same as those of the circuit board 10a, description thereof will be omitted.

According to the circuit board 10c, the most proximate first conductor layer 118a, the most proximate second conductor layer 118b, the most proximate third conductor layer 118c, and the most proximate fourth conductor layer 118d, which are close to each other, can be provided with high accuracy for the same reason as for the circuit board 10a. According to the circuit board 10c, the most proximate first conductor layer 118a, the most proximate second conductor layer 118b, the most proximate third conductor layer 118c, and the most proximate fourth conductor layer 118d can be formed in a short time for the same reason as for the circuit board 10a. According to the circuit board 10c, a decrease in strength of the insulator layer 16a can be reduced or prevented for the same reason as for the circuit board 10a. According to the circuit board 10c, capacitance generated between the most proximate first conductor layer 118a and the most proximate second conductor layer 118b, capacitance generated between the most proximate first conductor layer 118a and the most proximate third conductor layer 118c, and capacitance generated between the most proximate second conductor layer 118b and the most proximate fourth conductor layer 118d can be reduced for the same reason as for the circuit board 10a. Further, according to the circuit board 10c, the coil C including a large number of turns can be provided in a small space. Thus, the coil C having a high Q factor can be obtained.

Fourth Modification

Figure 16:
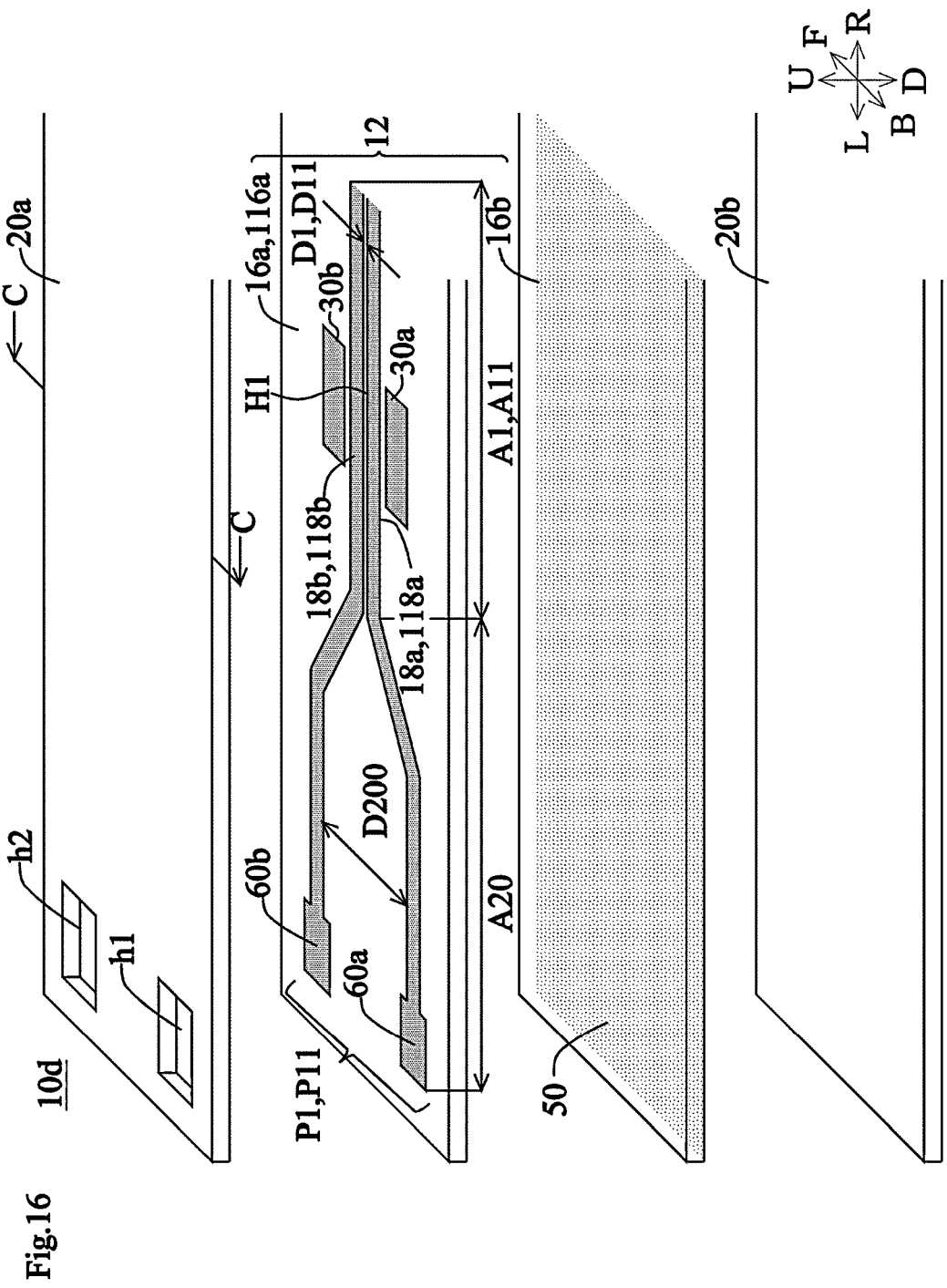
FIG. 16 is an exploded perspective view of a circuit board 10d according to a preferred embodiment of the present invention.
Figure 17:
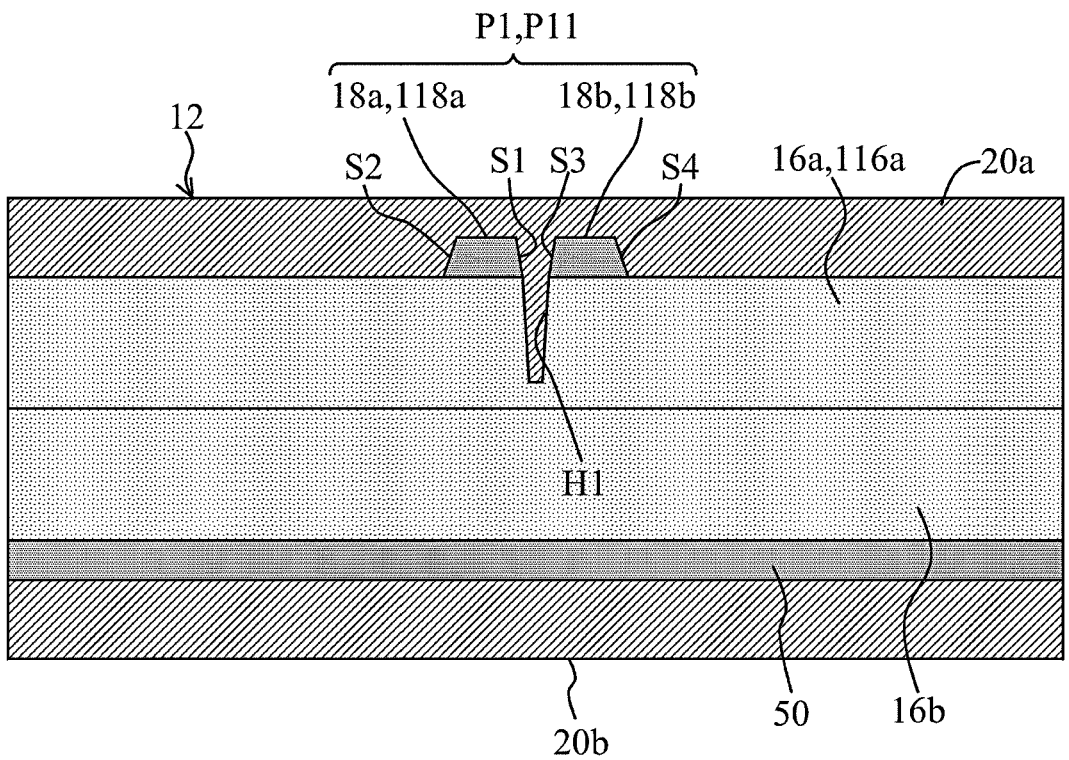
FIG. 17 is a sectional view of the circuit board 10d taken along line C-C.
Figure 17:
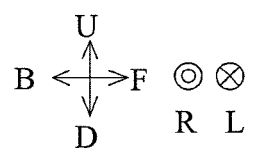

A structure of a circuit board 10d according to a fourth modification of a preferred embodiment of the present invention will be described below. FIG. 16 is an exploded perspective view of the circuit board 10d. FIG. 17 is a sectional view of the circuit board 10d taken along line C-C.

The circuit board 10d differs from the circuit board 10 in that the circuit board 10d has a microstripline structure. To be more specific, the circuit board 10d includes a ground conductor layer 50, instead of the conductor layers 18c and 18d. The ground conductor layer 50 covers or substantially covers the entire lower principal surface of the insulator layer 16b. Thus, when viewed in the up-down direction, the conductor layers 18a and 18b overlap the ground conductor layer 50. That is, the conductor layers 18a and 18b and the ground conductor layer 50 define the microstripline structure.

The conductor layer 18a is the most proximate first conductor layer 118a. The conductor layer 18b is the most proximate second conductor layer 118b. The pair P11 of the most proximate first conductor layer 118a and the most proximate second conductor layer 118b include the most proximate section A11 and a second proximity section A20 in which the most proximate first conductor layer 118a and the most proximate second conductor layer 118b are aligned in the back-forth direction (orthogonal direction). The second proximity section A20 is located to the left of the most proximate section A11. A distance D200 between the most proximate first conductor layer 118a and the most proximate second conductor layer 118b in the second proximity section A20 is greater than the first most proximate inter-conductor distance D11.

When viewed in the up-down direction, in an area located between the most proximate first conductor layer 118a and the most proximate second conductor layer 118b in the second proximity section A20 in the first insulator layer 116a, no groove is provided in the upper principal surface of the first insulator layer 116a.

The circuit board 10d also includes conductor layers 30a and 30b. The conductor layers 30a and 30b are provided on the upper principal surface of the first insulator layer 116a. To be more specific, the conductor layer 30a is located behind the most proximate first conductor layer 118a in the most proximate section A11. The conductor layer 30b is located in front of the most proximate second conductor layer 118b in the most proximate section A11.

The circuit board 10d further includes a first outer electrode 60a and a second outer electrode 60b. The first outer electrode 60a and the second outer electrode 60b are provided on the substrate body 12. In the present modification, the first outer electrode 60a and the second outer electrode 60b are provided on the upper principal surface of the first insulator layer 116a. The first outer electrode 60a is electrically connected to the most proximate first conductor layer 118a. The first outer electrode 60a is connected to a left end of the most proximate first conductor layer 118a. The second outer electrode 60b is electrically connected to the most proximate second conductor layer 118b. The second outer electrode 60b is connected to a left end of the most proximate second conductor layer 118b.

The protective layer 20a includes openings h1 and h2. The first outer electrode 60a and the second outer electrode 60b are exposed to the outside of the circuit board 10d from the openings h1 and h2, respectively. Thus, connectors and electronic components can be mounted on the first outer electrode 60a and the second outer electrode 60b. Since other structures of the circuit board 10d are the same or substantially the same as those of the circuit board 10, description thereof will be omitted.

According to the circuit board 10d, the most proximate first conductor layer 118a (conductor layer 18a) and the most proximate second conductor layer 118b (conductor layer 18b), which are close to each other, can be provided with high accuracy for the same reason as for the circuit board 10. According to the circuit board 10d, the most proximate first conductor layer 118a and the most proximate second conductor layer 118b can be formed in a short time for the same reason as for the circuit board 10. According to the circuit board 10d, a decrease in strength of the insulator layer 16a can be reduced or prevented for the same reason as for the circuit board 10. According to the circuit board 10d, capacitance generated between the most proximate first conductor layer 118a and the most proximate second conductor layer 118b can be reduced for the same reason as for the circuit board 10.

Including the conductor layers 30a and 30b, as in the circuit board 10d, requires a small distance between the most proximate first conductor layer 118a and the most proximate second conductor layer 118b. In the circuit board 10d, even when the distance between the most proximate first conductor layer 118a and the most proximate second conductor layer 118b is reduced, the capacitance generated between the most proximate first conductor layer 118a and the most proximate second conductor layer 118b can be reduced. Further, even when the distance between the most proximate first conductor layer 118a and the most proximate second conductor layer 118b is reduced, the first groove H1 reduces or prevents electric field coupling between the most proximate first conductor layer 118a and the most proximate second conductor layer 118b. As a result, a characteristic impedance of the circuit board 10d is less likely to change from a desired characteristic impedance (e.g., about 50Ω). When viewed in the up-down direction, in the area located between the most proximate first conductor layer 118a and the most proximate second conductor layer 118b in the second proximity section A20 in the first insulator layer 116a, a groove may be provided in the upper principal surface of the first insulator layer 116a. Electronic components may be provided instead of the conductor layers 30a and 30b.

Fifth Modification

Figure 18:
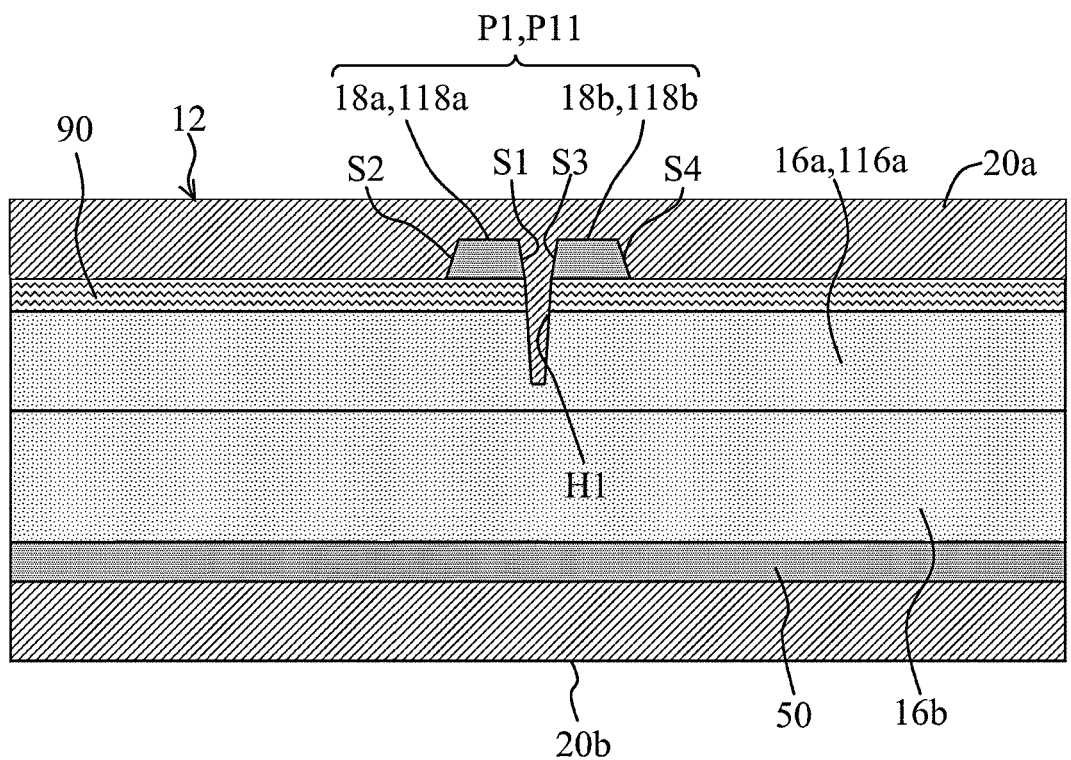
FIG. 18 is a sectional view of a circuit board 10e according to a preferred embodiment of the present invention.
Figure 18:
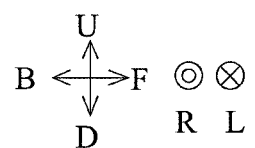

A structure of a circuit board 10e according to a fifth modification of a preferred embodiment of the present invention will be described below. FIG. 18 is a sectional view of the circuit board 10e.

The circuit board 10e differs from the circuit board 10d in that the circuit board 10e further includes an adhesive layer 90. The most proximate first conductor layer 118a and the most proximate second conductor layer 118b are fixed to the upper principal surface of the first insulator layer 116a with the adhesive layer 90 interposed therebetween. The first groove H1 passes through the adhesive layer 90 in the up-down direction. A dielectric constant of the adhesive layer 90 is lower than the dielectric constant of the first insulator layer 116a. Thus, capacitance formed between the most proximate first conductor layer 118a and the most proximate second conductor layer 118b can be reduced.

The most proximate first conductor layer 118a and the most proximate second conductor layer 118b are provided on the adhesive layer 90, and the first insulator layer 116a is provided under the adhesive layer 90. The dielectric constant of the first insulator layer 116a is higher than the dielectric constant of the adhesive layer 90. This reduces or prevents spread of the electric field generated by the most proximate first conductor layer 118a and the most proximate second conductor layer 118b around the circuit board 10e. Since other structures of the circuit board 10e are the same as those of the circuit board 10d, description thereof will be omitted.

In a non-limiting example of a method of manufacturing the circuit board 10e, the first groove H1 is formed in the first insulator layer 116a and the adhesive layer 90 in the beam irradiation step. The lower end of the first groove H1 does not extend to the lower principal surface of the first insulator layer 116a. After the beam irradiation step, the insulator layer 16b is stacked on the first insulator layer 116a. This reduces or prevents misalignment between the conductor layer 18a and the conductor layer 18b.

According to the circuit board 10e, the most proximate first conductor layer 118a (conductor layer 18a) and the most proximate second conductor layer 118b (conductor layer 18b), which are close to each other, can be provided with high accuracy for the same reason as for the circuit board 10d. According to the circuit board 10e, the most proximate first conductor layer 118a and the most proximate second conductor layer 118b can be formed in a short time for the same reason as for the circuit board 10d. According to the circuit board 10e, a decrease in strength of the insulator layer 16a can be reduced or prevented for the same reason as for the circuit board 10d. According to the circuit board 10e, the capacitance generated between the most proximate first conductor layer 118a and the most proximate second conductor layer 118b can be reduced for the same reason as for the circuit board 10d.

Sixth Modification

Figure 19:
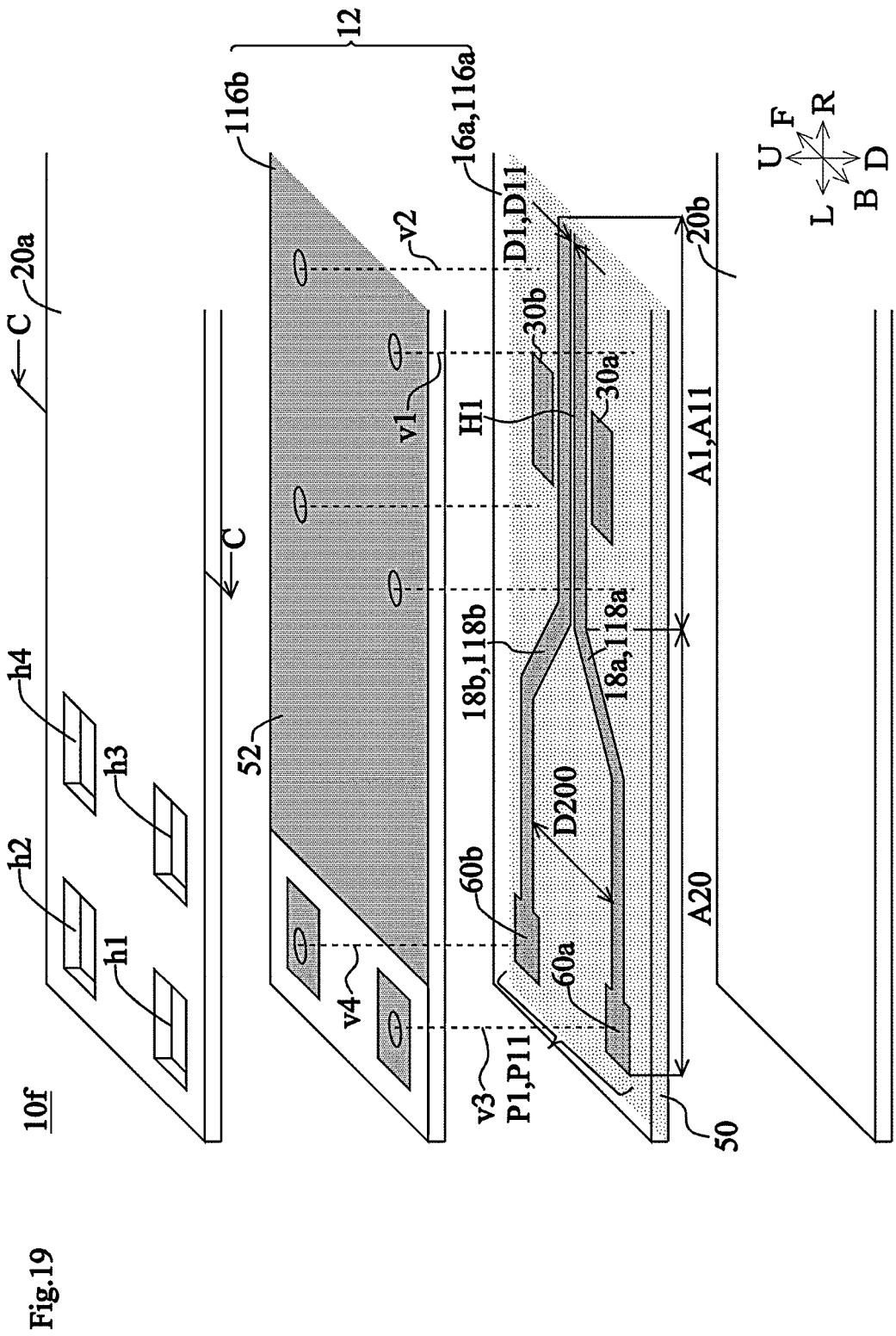
FIG. 19 is an exploded perspective view of a circuit board 10f according to a preferred embodiment of the present invention.
Figure 20:
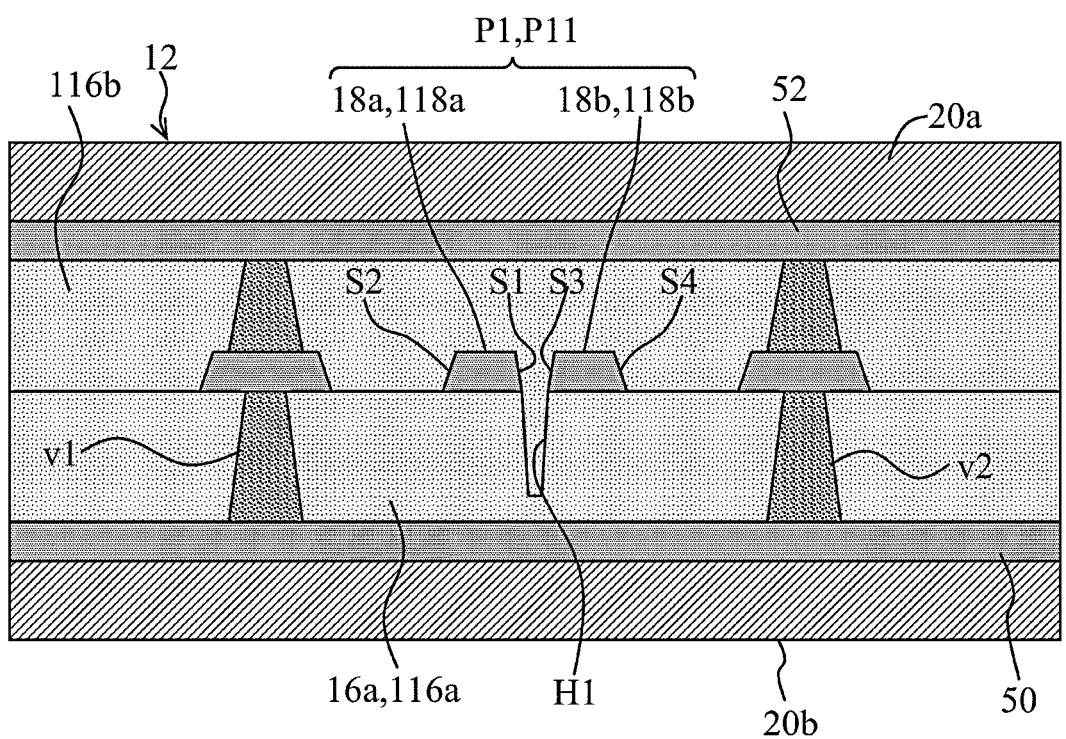
FIG. 20 is a sectional view of the circuit board 10f taken along line C-C.
Figure 20:
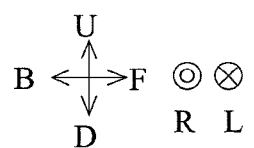

A structure of a circuit board 10f according to a sixth modification of a preferred embodiment of the present invention will be described below. FIG. 19 is an exploded perspective view of the circuit board 10f. FIG. 20 is a sectional view of the circuit board 10f taken along line C-C.

The circuit board 10f differs from the circuit board 10d in that the circuit board 10f has a stripline structure. The substrate body 12 further includes the second insulator layer 116b. The second insulator layer 116b is located on the first insulator layer 116a. The second insulator layer 116b is stacked on the first insulator layer 116a. The material of the first insulator layer 116a is the same as the material of the second insulator layer 116b. A portion of the second insulator layer 116b is located in the first groove H1 formed in the first insulator layer 116a. However, the first groove H1 is formed by, for example, laser beam irradiation. Consequently, a molecular structure of the inner surface of the first groove H1 is slightly changed by heating. Consequently, the inner surface of the first groove H1 can be confirmed with an electronic microscope such as an SEM, for example.

The circuit board 10f further includes a ground conductor layer 52 and multiple via-hole conductors v1 and v2. The ground conductor layer 52 covers or substantially covers an entire upper principal surface of the second insulator layer 116b. Thus, the ground conductor layer 52 overlaps the most proximate first conductor layer 118a and the most proximate second conductor layer 118b when viewed in the up-down direction.

The ground conductor layer 50 covers or substantially covers the entire lower principal surface of the first insulator layer 116a. Thus, the ground conductor layer 50 overlaps the most proximate first conductor layer 118a and the most proximate second conductor layer 118b when viewed in the up-down direction. Thus, the most proximate first conductor layer 118a, the most proximate second conductor layer 118b, and the ground conductor layers 50 and 52 define a stripline structure.

The multiple via-hole conductors v1 and v2 electrically connect the ground conductor layer 50 and the ground conductor layer 52. The multiple via-hole conductors v1 and v2 pass through the first insulator layer 116a and the second insulator layer 116b in the up-down direction. The multiple via-hole conductors v1 are aligned in a line in the right-left direction behind the most proximate first conductor layer 118a and the most proximate second conductor layer 118b. The multiple via-hole conductors v2 are aligned in a line in the right-left direction in front of the most proximate first conductor layer 118a and the most proximate second conductor layer 118b.

The first outer electrode 60a and the second outer electrode 60b are provided on the upper principal surface of the first insulator layer 116a. The first outer electrode 60a overlaps the left end portion of the most proximate first conductor layer 118a when viewed in the up-down direction. The second outer electrode 60b overlaps the left end portion of the most proximate second conductor layer 118b when viewed in the up-down direction.

The circuit board 10f further includes via-hole conductors v3 and v4. The via-hole conductor v3 electrically connects the first outer electrode 60a to the left end portion of the most proximate first conductor layer 118a. The via-hole conductor v4 electrically connects the second outer electrode 60b to the left end portion of the most proximate second conductor layer 118b. The via-hole conductors v3 and v4 pass through the second insulator layer 116b in the up-down direction.

The protective layer 20a includes openings h1 to h4. The first outer electrode 60a and the second outer electrode 60b are exposed to the outside of the circuit board 10f from the openings h1 and h2, respectively. A portion of the ground conductor layer 52 is exposed from the openings h3 and h4 to the outside of the circuit board 10f. Thus, connectors and electronic components can be mounted on the first outer electrode 60a, the second outer electrode 60b, and the ground conductor layer 52. Since other structures of the circuit board 10f are the same or substantially the same as those of the circuit board 10d, description thereof will be omitted.

According to the circuit board 10f, the most proximate first conductor layer 118a (conductor layer 18a) and the most proximate second conductor layer 118b (conductor layer 18b), which are close to each other, can be provided with high accuracy for the same reason as for the circuit board 10d. According to the circuit board 10f, the most proximate first conductor layer 118a and the most proximate second conductor layer 118b can be formed in a short time for the same reason as for the circuit board 10d. According to the circuit board 10f, a decrease in strength of the insulator layer 16a can be reduced or prevented for the same reason as for the circuit board 10d.

Seventh Modification

Figure 21:
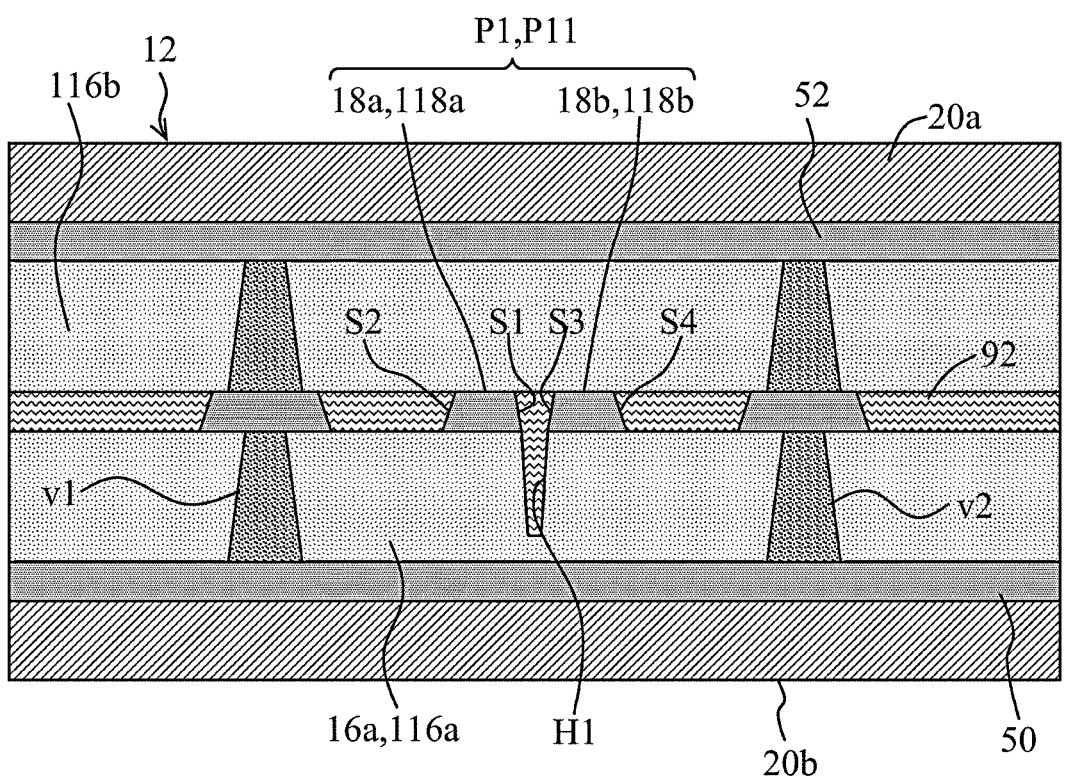
FIG. 21 is a sectional view of a circuit board 10g.
Figure 21:
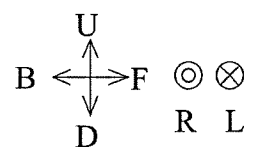

A structure of a circuit board 10g according to a seventh modification of a preferred embodiment of the present invention will be described below. FIG. 21 is a sectional view of the circuit board 10g.

The circuit board 10g differs from the circuit board 10f in that the circuit board 10g further includes a second adhesive layer 92. The second insulator layer 116b is fixed to the first insulator layer 116a with the second adhesive layer 92 interposed therebetween. A dielectric constant of the second adhesive layer 92 is lower than the dielectric constant of the first insulator layer 116a. A portion of the second adhesive layer 92 is located in the first groove H1. However, the portion of the second adhesive layer 92 does not have to be located in the first groove H1. Since other structures of the circuit board 10g are the same as those of the circuit board 10f, description thereof will be omitted. Note that the first groove H1 does not have to be completely filled with the second adhesive layer 92.

According to the circuit board 10g, the most proximate first conductor layer 118a (conductor layer 18a) and the most proximate second conductor layer 118b (conductor layer 18b), which are close to each other, can be provided with high accuracy for the same reason as for the circuit board 10f. According to the circuit board 10g, the most proximate first conductor layer 118a and the most proximate second conductor layer 118b can be formed in a short time for the same reason as for the circuit board 10f. According to the circuit board 10g, a decrease in strength of the insulator layer 16a can be reduced or prevented for the same reason as for the circuit board 10f. According to the circuit board 10g, capacitance generated between the most proximate first conductor layer 118a and the most proximate second conductor layer 118b can be reduced for the same reason as for the circuit board 10f.

Other Preferred Embodiments

The circuit boards according to preferred embodiments of the present invention is not limited to the circuit boards 10 and 10a to 10g and can be changed within the scope of the gist thereof. In addition, the structures of the circuit boards 10 and 10a to 10g may be combined as desired.

In the circuit boards 10 and 10a to 10g, the most proximate second conductor layer 118b does not have to be a signal line. The most proximate second conductor layer 118b may be, for example, a ground conductor layer or a power supply line.

In the circuit boards 10 and 10a to 10g, the protective layers 20a and 20b are not necessary.

In the circuit boards 10 and 10a to 10g, the maximum value D100 of the width of the first groove H1 in the back-forth direction (orthogonal direction) may be shorter than the first most proximate inter-conductor distance D11. In this case, the upper principal surface of the first insulator layer 116a is visible between the first side surface S1 and the inner surface of the first groove H1. The upper principal surface of the first insulator layer 116a is visible between the third side surface S3 and the inner surface of the first groove H1.

In the circuit boards 10 and 10a to 10g, when the first groove H1 is formed by laser beam irradiation, for example, the first groove H1 may become wider in some cases. In this case, the first groove H1 may extend under the most proximate first conductor layer 118a and under the most proximate second conductor layer 118b.

In the circuit boards 10 and 10d to 10f, the lower end of the first groove H1 may extend below the lower principal surface of the first insulator layer 116a. In this case, the laser beam irradiation is performed after stacking the first insulator layer 116a and the insulator layer 16b.

The first groove H1 may extend to a lower end of the first insulator layer 116a.

The surface roughness of the inner surface s0 of the first groove H1 may be larger or smaller than the surface roughness of the surface s11 of the first insulator layer 116a with which the most proximate first conductor layer 118a is in contact.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
a substrate body including one or more insulator layers, an upper principal surface, and a lower principal surface with a normal line extending in an up-down direction; and
a plurality of conductor layers in or on the substrate body; wherein
the plurality of conductor layers include one or more pairs of a first conductor layer and a second conductor layer provided on one of the one or more insulator layers;
each of the one or more pairs of the first conductor layer and the second conductor layer includes a first proximity section in which the first conductor layer and the second conductor layer are aligned in an orthogonal direction orthogonal or substantially orthogonal to an extending direction of the first conductor layer;
a distance between the first conductor layer and the second conductor layer in the first proximity section is defined as a proximity distance;
the one or more insulator layers includes a first insulator layer;

a most proximate first conductor layer and a most proximate second conductor layer are defined as the first and second conductor layers with a smallest proximity distance and are located on an upper principal surface of the first insulator layer;

the most proximate first conductor layer includes a first side surface and a second side surface aligned in the orthogonal direction;

the most proximate second conductor layer includes a third side surface and a fourth side surface aligned in the orthogonal direction;

the first side surface and the third side surface face each other; and a first acute angle between the first side surface and the upper principal surface of the first insulator layer is larger than a second acute angle between the second side surface and the upper principal surface of the first insulator layer.

2. The circuit board according to claim 1, wherein
the first conductor layer has a linear shape when viewed in the up-down direction;

a pair of the first conductor layer and the second conductor layer having a smallest proximity distance is defined as a pair of the most proximate first conductor layer and the most proximate second conductor layer; and when viewed in the up-down direction, in at least a portion of an area located between the most proximate first conductor layer and the most proximate second conductor layer in the first proximity section in the first insulator layer, a first groove is provided in the upper principal surface of the first insulator layer.

3. The circuit board according to claim 2, wherein
the most proximate first conductor layer includes a first side surface and a second side surface aligned in the orthogonal direction;

the most proximate second conductor layer includes a third side surface and a fourth side surface aligned in the orthogonal direction;

the first side surface and the third side surface face each other;

the upper principal surface of the first insulator layer is not visible between the first side surface and an inner surface of the first groove; and the upper principal surface of the first insulator layer is not visible between the third side surface and the inner surface of the first groove.

4. The circuit board according to claim 2, wherein
the proximity distance between the most proximate first conductor layer and the most proximate second conductor layer in the first proximity section is defined as a first most proximate inter-conductor distance, and a maximum value of a width of the first groove in the orthogonal direction is greater than or equal to the first most proximate inter-conductor distance.

5. The circuit board according to claim 2, wherein a lower end of the first groove is located above a lower principal surface of the first insulator layer.

6. The circuit board according to claim 2, wherein
the most proximate first conductor layer and the most proximate second conductor layer are fixed to the upper principal surface of the first insulator layer with an adhesive layer interposed between the most proximate first conductor layer and the most proximate second conductor layer and the first insulator layer; and the first groove passes through the adhesive layer in the up-down direction.

7. The circuit board according to claim 2, wherein the first groove is filled with an insulating material having a dielectric constant lower than a dielectric constant of the first insulator layer.

8. The circuit board according to claim 1, wherein the first conductor layer is a signal line to transmit a first high-frequency signal.

9. The circuit board according to claim 1, wherein the most proximate second conductor layer is a signal line to transmit a second high-frequency signal.

10. The circuit board according to claim 9, wherein
the most proximate first conductor layer and the most proximate second conductor layer include a most proximate section and a second proximity section in which the most proximate first conductor layer and the most proximate second conductor layer are aligned in the orthogonal direction;

a distance between the most proximate first conductor layer and the most proximate second conductor layer in the most proximate section is defined as a first most proximate inter-conductor distance;

a distance between the most proximate first conductor layer and the most proximate second conductor layer in the second proximity section is greater than the first most proximate inter-conductor distance; and when viewed in the up-down direction, in an area located between the most proximate first conductor layer and the most proximate second conductor layer in the second proximity section in the first insulator layer, no groove is provided in the upper principal surface of the first insulator layer.

11. The circuit board according to claim 9, further comprising:
a first outer electrode provided on the substrate body and electrically connected to the most proximate first conductor layer; and a second outer electrode provided on the substrate body and electrically connected to the most proximate second conductor layer.

12. The circuit board according to claim 1, further comprising:
a most proximate third conductor layer provided on the upper principal surface of the first insulator layer; wherein the most proximate first conductor layer and the most proximate second conductor layer include a most proximate section in which the most proximate first conductor layer and the most proximate second conductor layer are aligned in the orthogonal direction;

the most proximate first conductor layer is provided between the most proximate second conductor layer and the most proximate third conductor layer in the orthogonal direction in the most proximate section;

the most proximate second conductor layer and the most proximate third conductor layer are connected to a ground potential; and when viewed in the up-down direction, in an area located between the most proximate first conductor layer and the most proximate third conductor layer in the most proximate section in the first insulator layer, a second groove is provided in the upper principal surface of the first insulator layer.

13. The circuit board according to claim 2, wherein
the one or more insulator layers further includes a second insulator layer located on the first insulator layer;

the second insulator layer is fixed to the first insulator layer with a second adhesive layer interposed between the first insulator layer and the second insulator layer;

a dielectric constant of the second adhesive layer is lower than a dielectric constant of the first insulator layer; and a portion of the second adhesive layer is located in the first groove.

14. The circuit board according to claim 1, wherein the most proximate first conductor layer includes a first side surface and a second side surface aligned in the orthogonal direction;

the most proximate second conductor layer includes a third side surface and a fourth side surface aligned in the orthogonal direction;

the first side surface and the third side surface face each other; and the circuit board further comprises:

a protective layer provided on the upper principal surface of the first insulator layer, covering the second side surface and the fourth side surface, and not covering the first side surface or the third side surface.

15. A circuit board comprising:

a substrate body including one or more insulator layers, an upper principal surface, and a lower principal surface with a normal line extending in an up-down direction; and a plurality of conductor layers in or on the substrate body; wherein the plurality of conductor layers include one or more pairs of a first conductor layer and a second conductor layer provided on one of the one or more insulator layers;

each of the one or more pairs of the first conductor layer and the second conductor layer includes a first proximity section in which the first conductor layer and the second conductor layer are aligned in an orthogonal direction orthogonal or substantially orthogonal to an extending direction of the first conductor layer;

a distance between the first conductor layer and the second conductor layer in the first proximity section is defined as a proximity distance;

the one or more insulator layers includes a first insulator layer;

a most proximate first conductor layer and a most proximate second conductor layer are provided on an upper principal surface of the first insulator layer;

a groove is provided between the first and second conductor layers; and no groove is provided on either of outer sides of the first and second conductor layers.

16. The circuit board according to claim 15, wherein the most proximate first conductor layer includes a first side surface and a second side surface aligned in the orthogonal direction;

the most proximate second conductor layer includes a third side surface and a fourth side surface aligned in the orthogonal direction;

the first side surface and the third side surface face each other; and a first acute angle between the first side surface and the upper principal surface of the first insulator layer is larger than a second acute angle between the second side surface and the upper principal surface of the first insulator layer.

17. The circuit board according to claim 15, wherein the first conductor layer is a signal line to transmit a first high-frequency signal.

18. The circuit board according to claim 15, wherein the most proximate second conductor layer is a signal line to transmit a second high-frequency signal.

19. The circuit board according to claim 18, wherein the most proximate first conductor layer and the most proximate second conductor layer include a most proximate section and a second proximity section in which the most proximate first conductor layer and the most proximate second conductor layer are aligned in the orthogonal direction;

a distance between the most proximate first conductor layer and the most proximate second conductor layer in the most proximate section is defined as a first most proximate inter-conductor distance;

a distance between the most proximate first conductor layer and the most proximate second conductor layer in the second proximity section is greater than the first most proximate inter-conductor distance; and when viewed in the up-down direction, in an area located between the most proximate first conductor layer and the most proximate second conductor layer in the second proximity section in the first insulator layer, no groove is provided in the upper principal surface of the first insulator layer.

20. The circuit board according to claim 18, further comprising:

a first outer electrode provided on the substrate body and electrically connected to the most proximate first conductor layer; and a second outer electrode provided on the substrate body and electrically connected to the most proximate second conductor layer.

* * * * *